United States Patent
Wang et al.

(10) Patent No.: US 11,088,680 B2
(45) Date of Patent: Aug. 10, 2021

(54) METHOD AND APPARATUS FOR ELIMINATING CROSSTALK EFFECTS IN HIGH SWITCHING-SPEED POWER MODULES

(71) Applicant: University of Florida Research Foundation, Incorporated, Gainesville, FL (US)

(72) Inventors: Shuo Wang, Gainesville, FL (US); Boyi Zhang, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 16/930,683

(22) Filed: Jul. 16, 2020

(65) Prior Publication Data

US 2021/0021258 A1 Jan. 21, 2021

Related U.S. Application Data

(60) Provisional application No. 62/876,569, filed on Jul. 19, 2019.

(51) Int. Cl.
*H03K 5/1252* (2006.01)
*H03K 17/687* (2006.01)

(52) U.S. Cl.
CPC ......... *H03K 5/1252* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 3,508,075 A * | 4/1970 | Savage | .................. | G01R 23/00 327/39 |
| 7,791,380 B2 * | 9/2010 | Bramante | ............ | G11C 27/028 327/94 |
| 8,497,711 B2 * | 7/2013 | Hsieh | .................. | H04L 25/0292 327/58 |
| 8,680,837 B2 * | 3/2014 | Zeng | .................. | H03K 17/6877 323/289 |
| 9,774,244 B2 * | 9/2017 | Cyr | ....................... | H02M 7/538 |
| 2006/0284670 A1 * | 12/2006 | Eid | ..................... | H03F 3/45183 327/563 |
| 2010/0141326 A1 * | 6/2010 | Tumminaro | ..... | H03K 17/04123 327/374 |

(Continued)

*Primary Examiner* — Lincoln D Donovan
*Assistant Examiner* — Khareem E Almo
(74) *Attorney, Agent, or Firm* — Alston & Bird LLP

(57) ABSTRACT

Methods and apparatus for reducing Miller effect in SiC MOSFETs are provided. An example apparatus includes a plurality of SiC MOSFETs and a Miller current cancellation circuit configured to mitigate Miller current induced by switching transients associated with the plurality of SiC MOSFETS. The Miller current cancellation circuit includes a two-stage voltage sampling circuit configured to sample a drain to source voltage of a SiC MOSFET of the plurality of SiC MOSFETs, a voltage inverting circuit configured to invert the sampled drain to source voltage, and an injection capacitor configured to generate, by way of receiving the inverted sampled drain to source voltage as input, inverse Miller current to mitigate the Miller current within the plurality of SiC MOSFETS.

15 Claims, 18 Drawing Sheets

(56) References Cited

U.S. PATENT DOCUMENTS

| | | | | |
|---|---|---|---|---|
| 2014/0197878 A1* | 7/2014 | Sun | ............................ | G01J 5/10 |
| | | | | 327/434 |
| 2016/0043711 A1* | 2/2016 | Cyr | ....................... | H03K 17/082 |
| | | | | 318/400.22 |
| 2018/0226930 A1* | 8/2018 | Schober | ............ | H03K 19/00384 |
| 2019/0158133 A1* | 5/2019 | Wang | ......................... | H03F 3/19 |
| 2019/0334491 A1* | 10/2019 | Schober | ............ | H03K 19/00384 |
| 2020/0395905 A1* | 12/2020 | Schober | ............ | H03K 19/00384 |

* cited by examiner

Measured switching waveform during S1 turn on transient

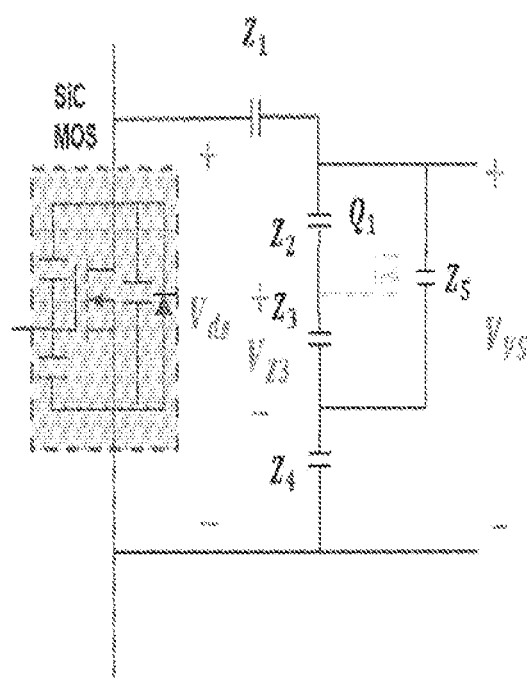 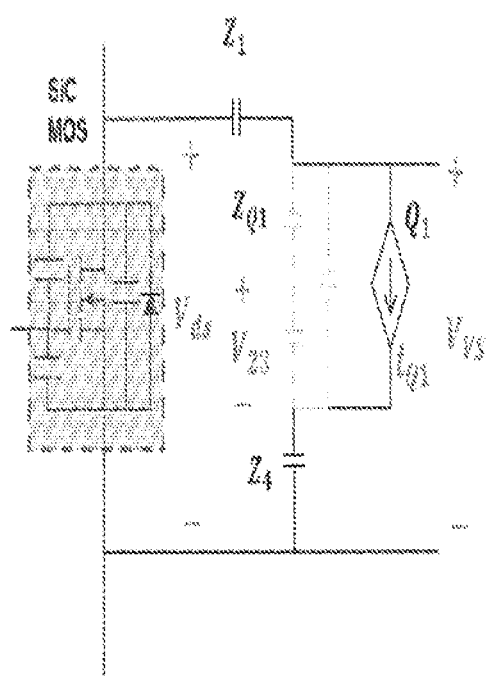
FIG. 5A
(Stage 1)
FIG. 5B
(Stage 2)

METHOD AND APPARATUS FOR ELIMINATING CROSSTALK EFFECTS IN HIGH SWITCHING-SPEED POWER MODULES

CROSS-REFERENCE TO RELATED APPLICATIONS

The present application claims priority to U.S. Provisional Application Ser. No. 62/876,569, titled "METHOD AND APPARATUS FOR ELIMINATING CROSSTALK EFFECTS IN HIGH SWITCHING-SPEED POWER MODULES," filed Jul. 19, 2020, the contents of which are incorporated herein by reference in their entirety.

BACKGROUND

SiC MOSFETs have smaller on-resistance, smaller junction capacitance, and higher maximum operation temperature under similar power ratings compared to Si devices. As a result, SiC MOSFET is a promising candidate to replace Si IGBT in high power applications such as electric vehicles and the aviation industry. However, the full high-speed potential of SiC MOSFETs is usually not realized in these applications. One of the major reasons is the Miller effect.

For the SiC MOSFETs in a phase-leg configuration, there are two types of Miller effect: The coupling between power loop and drive loop, and the coupling between the top and the bottom switches. The coupling between the power loop and the drive loop causes the gate voltage to be clamped at a constant value for a period of time during switching transient. This is also known as the Miller plateau. The length of the Miller plateau determines the switching speed of the device.

The coupling between the top and bottom switches is the interactions between the two switches in a phase-leg configuration at high dv/dt switching. Positive and negative voltage spikes are induced at the gates of the devices; this is also known as the crosstalk effect. The positive voltage spike causes potential false triggering, which lead to hazardous shoot-through failure. The negative gate voltage spike could cause a gate-oxide breakdown. In industrial applications, both false triggering and negative voltage over-range must be avoided by all means. It is worth noting that the common source inductance (CSI) also contributes to the crosstalk effect. Reducing the value of CSI by Kelvin connection or package optimization usually mitigates the crosstalk caused by CSI. In contrast, the Miller capacitance is an intrinsic property of the power device. Reducing the crosstalk caused by the Miller capacitance is a major challenge.

Techniques to suppress the crosstalk effect in the bridge-leg configuration have been proposed. These techniques mainly fall into three categories:

1. Reducing the switching speed. Increasing the gate resistor value or adding an additional gate capacitor can effectively mitigate the crosstalk effect. However, by doing this, the switching speed of the power device would be sacrificed.

2. Control the gate loop impedance. The magnitude of the induced gate voltage depends on the impedance of the drive loop. As a result, providing a low-impedance path between the gate and source of the victim device mitigates the crosstalk. Controlling the gate impedance usually requires complicate circuit design and control logic.

3. Applying Multi-level driver voltage. Multi-level gate voltage techniques do not suppress the induced gate voltage spikes. Instead, different levels of off-state gate voltage are added to prevent false triggering and negative voltage over-range after the crosstalk has occurred. In cases with SiC MOSFETs, both positive and negative induced gate voltage spikes are high due to high switching speed. The off-state gate voltage must be controlled precisely to avoid false triggering and negative breakdown at the same time. The design of a multi-level gate driver becomes costly and challenging.

Some research attempts to reduce the Miller plateau. Closed-loop techniques compare the sampled voltage and/or current waveforms to the desired waveforms, then change the gate voltage accordingly. The closed-loop techniques require many additional analog and/or digital circuits design. The crosstalk effect is not considered in these closed-loop driver design. In some cases, applying a closed-loop driver increases the chances of false-triggering and requires additional circuits.

Applicant has identified many deficiencies and problems associated with existing methods and apparatuses. Through applied effort, ingenuity, and innovation, these identified deficiencies and problems have been solved by developing solutions that are in accordance with the embodiments of the present disclosure, many examples of which are described in detail herein.

BRIEF SUMMARY

Methods and apparatus for reducing Miller effect in SiC MOSFETs are provided. An example apparatus includes a plurality of SiC MOSFETs and a Miller current cancellation circuit configured to mitigate Miller current induced by switching transients associated with the plurality of SiC MOSFETS. The Miller current cancellation circuit includes a two-stage voltage sampling circuit configured to sample a drain to source voltage of a SiC MOSFET of the plurality of SiC MOSFETs, a voltage inverting circuit configured to invert the sampled drain to source voltage, and an injection capacitor configured to generate, by way of receiving the inverted sampled drain to source voltage as input, inverse Miller current to mitigate the Miller current within the plurality of SiC MOSFETS.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Figure 1B:
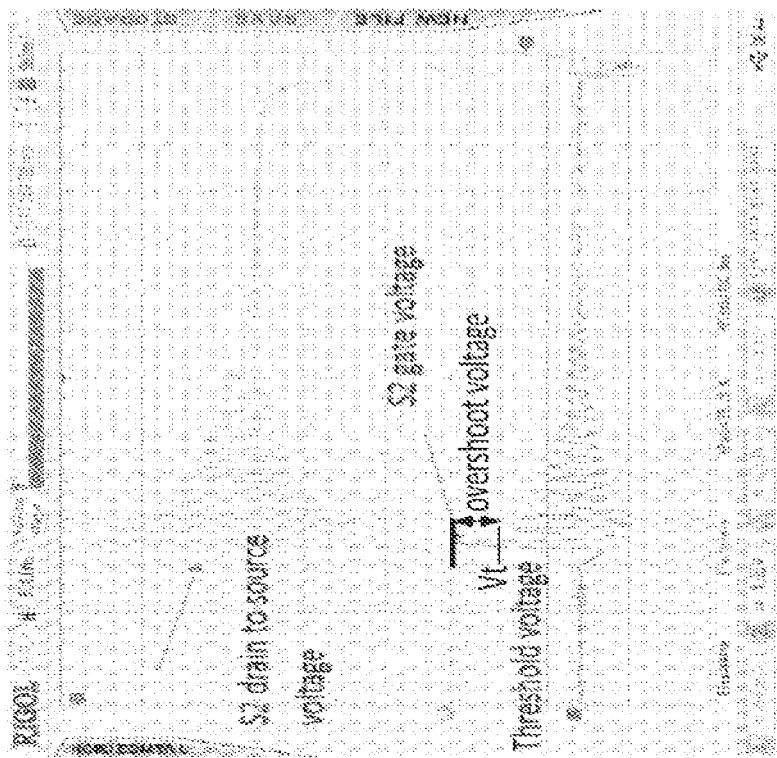
Figure 1A:
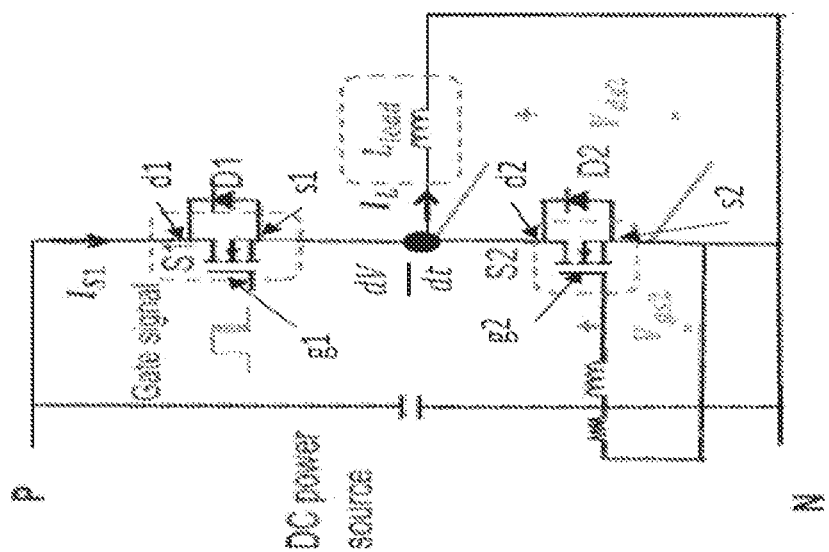
Figures 2A, 2B:
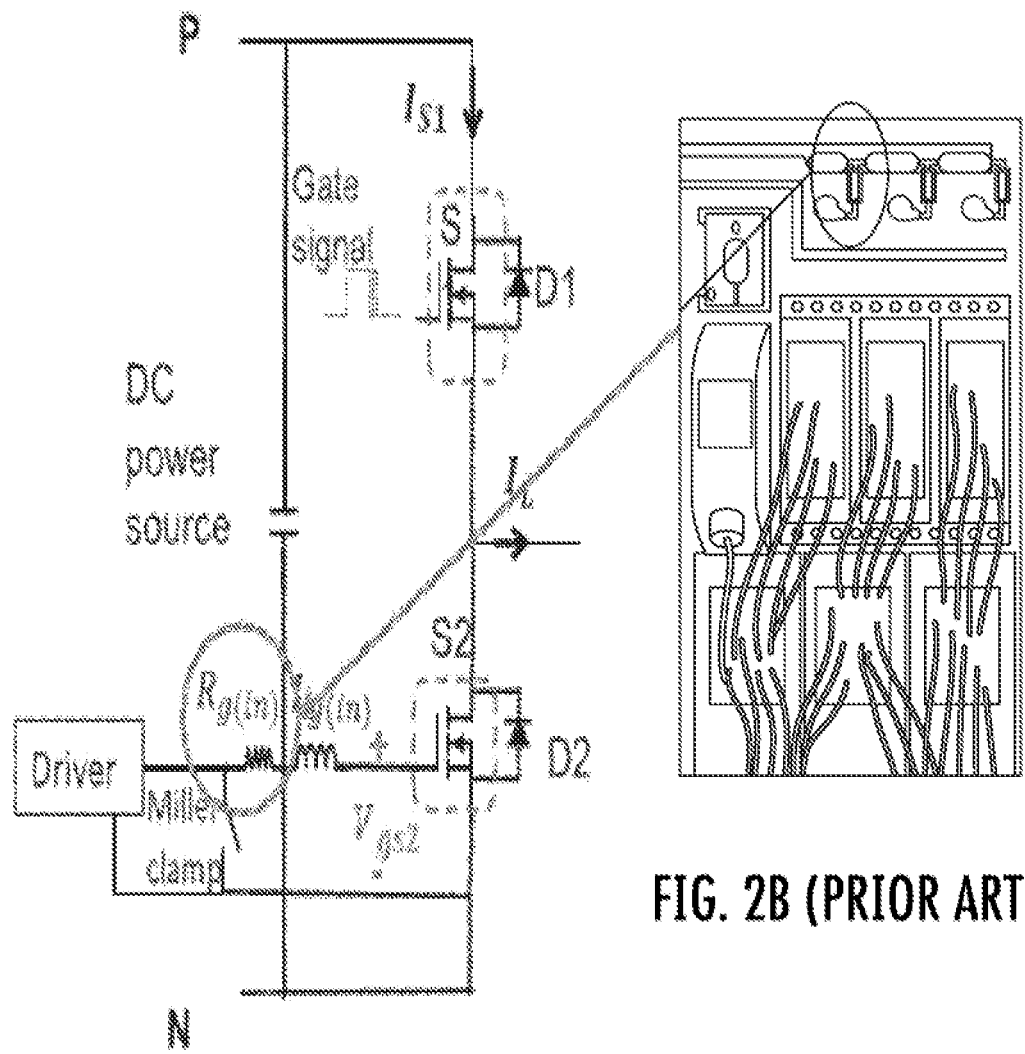
Figure 4:
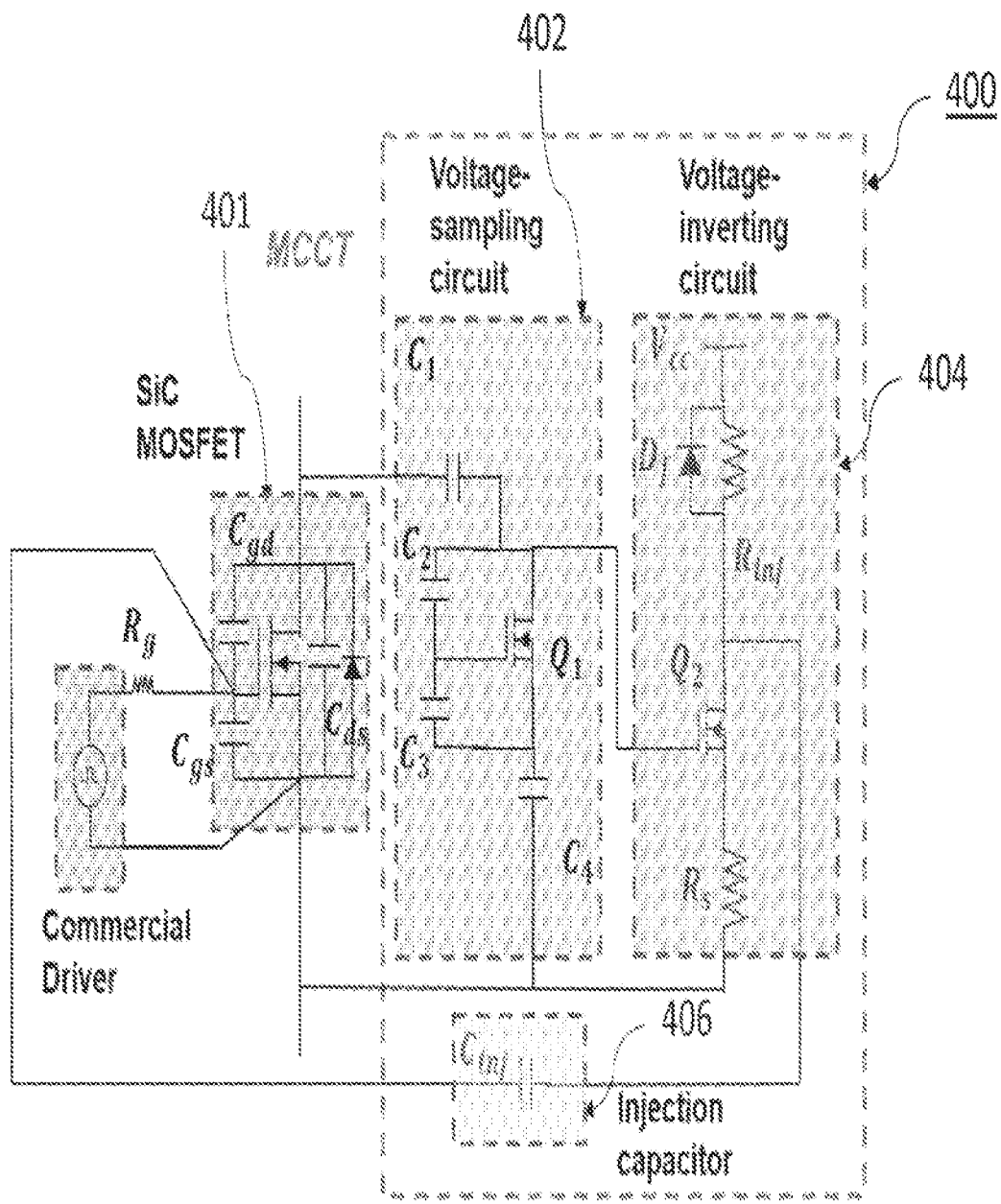
Figure 6:
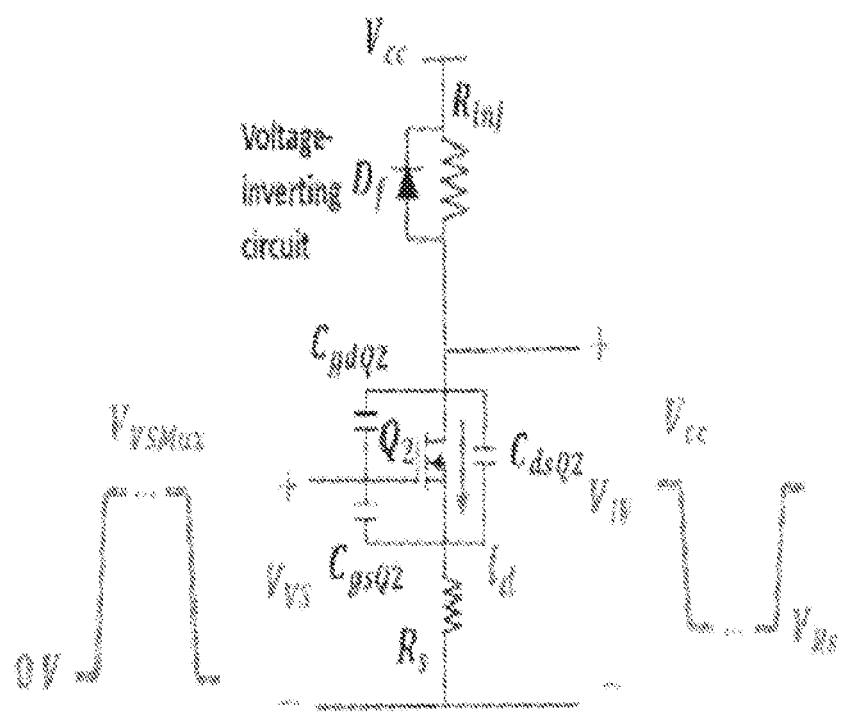
Figure 7:
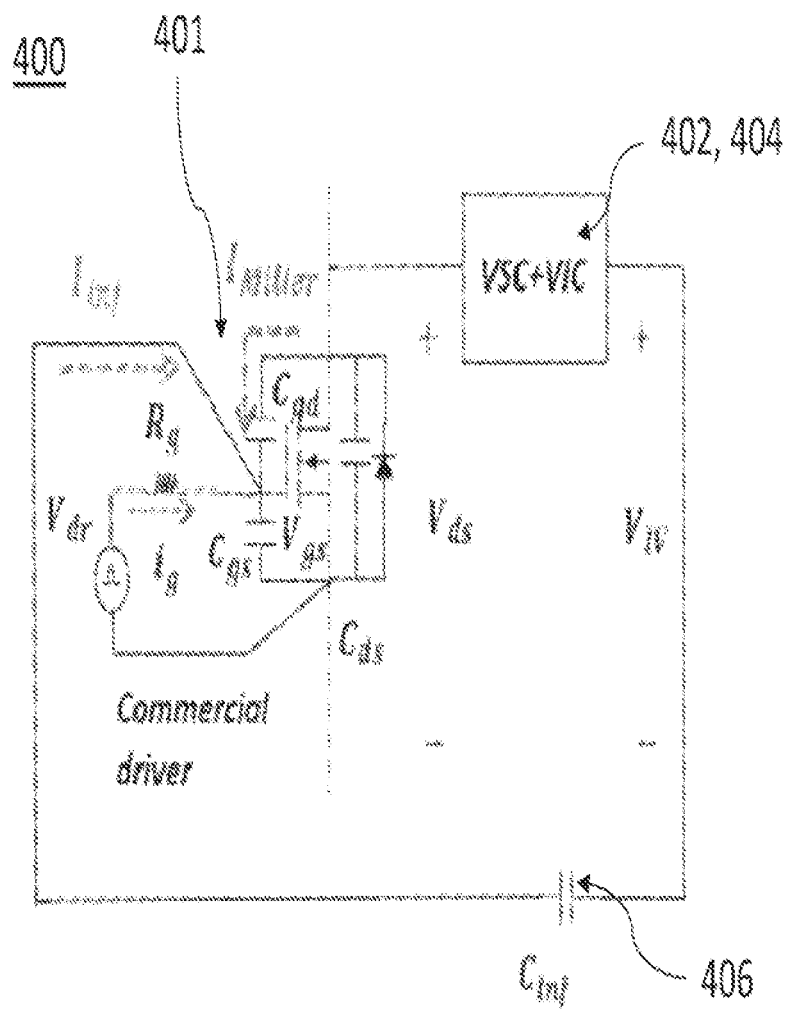
Figures 8A, 8B:
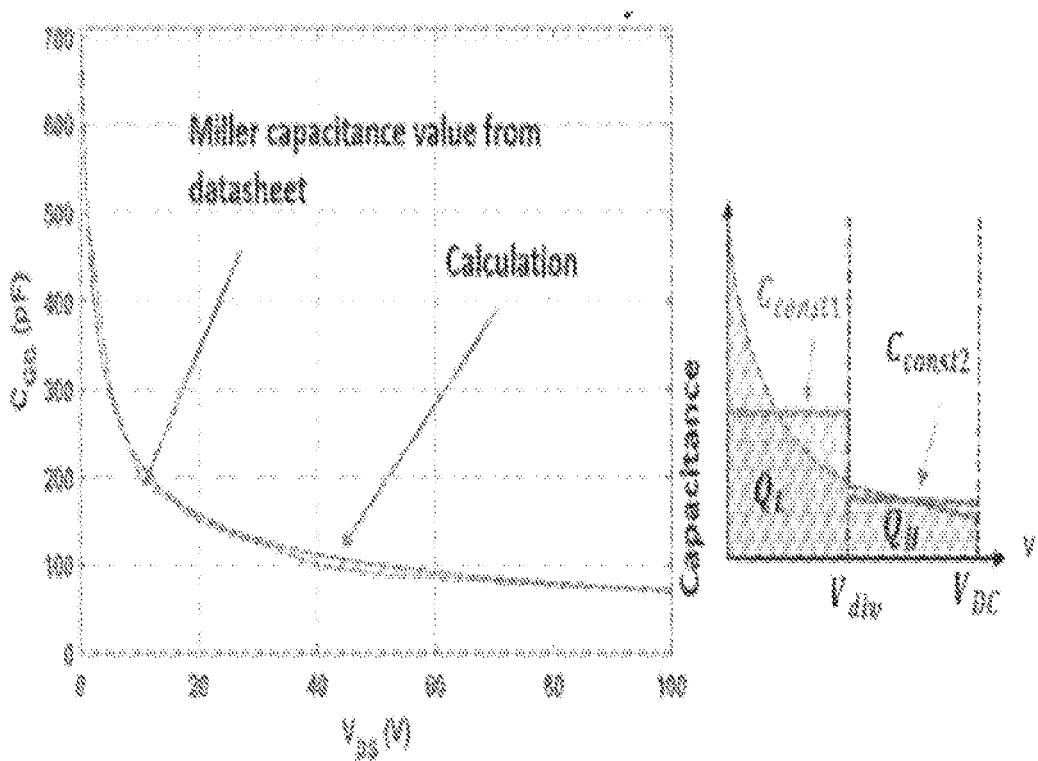
Figure 9A:
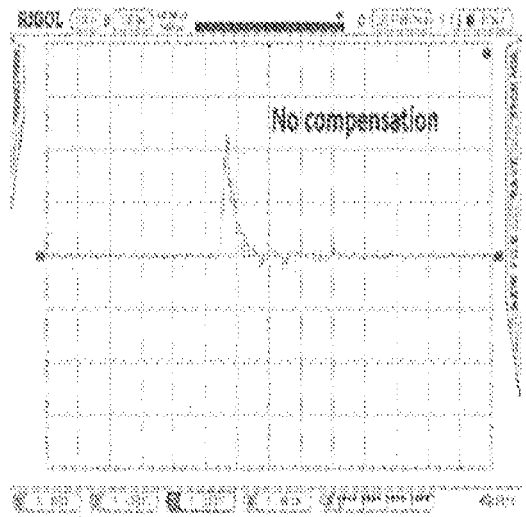
Figure 9B:
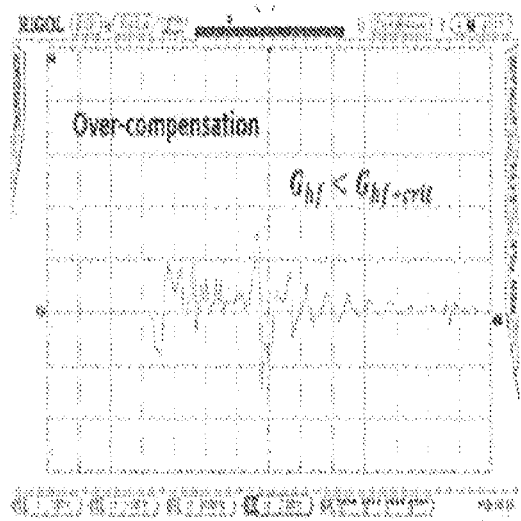
Figure 9C:
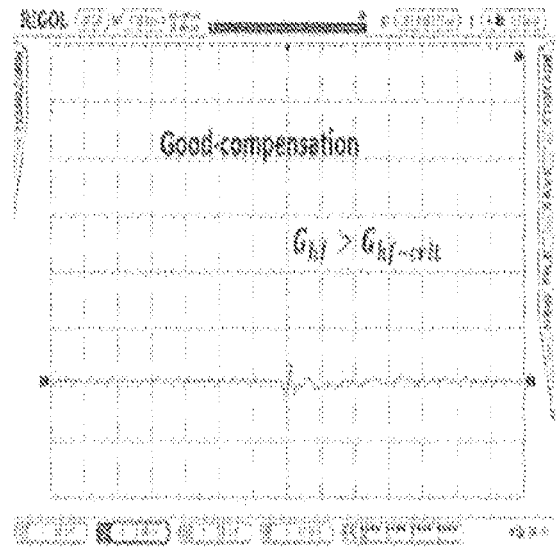
Figure 10:
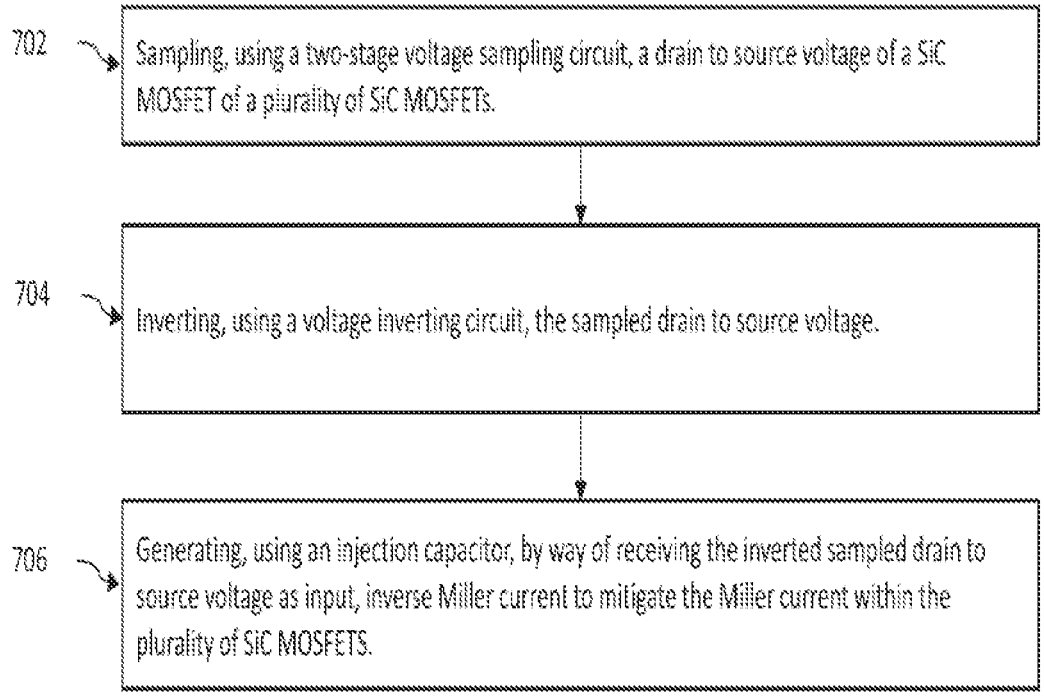
Figure 16:
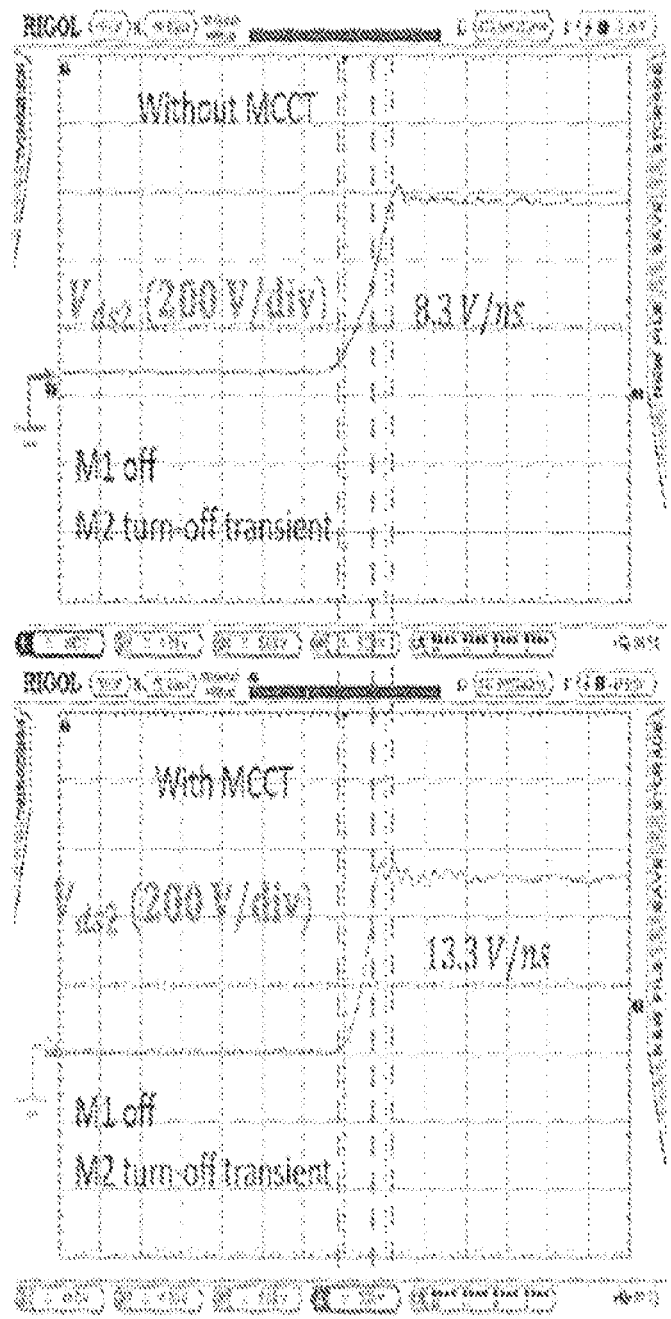
Figure 17B:
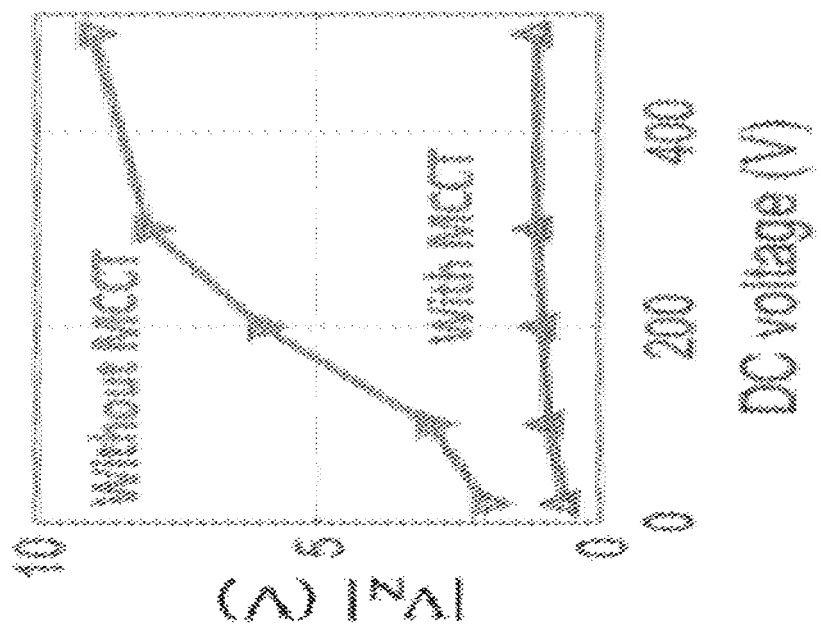
Figure 17A:
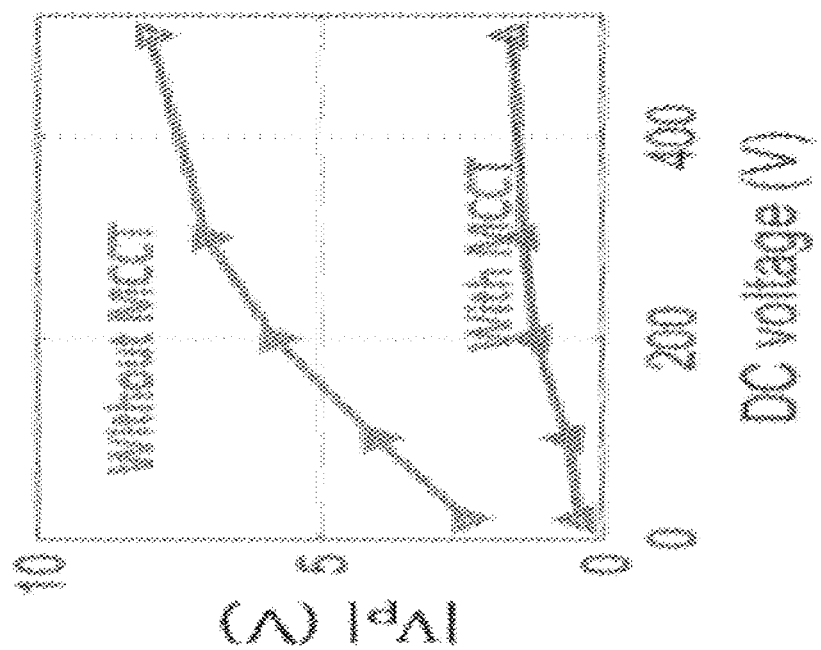
Figure 18:
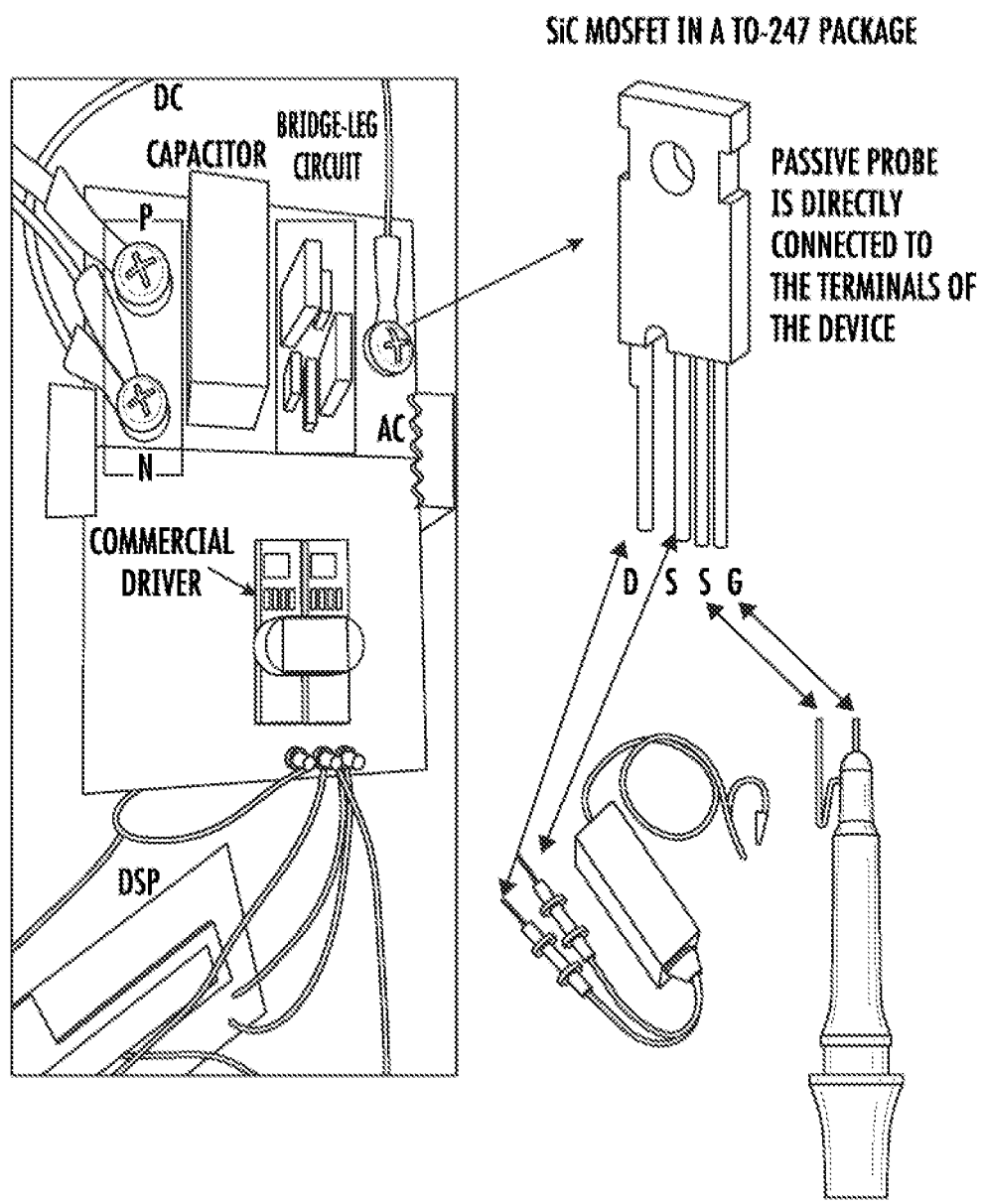

Having thus described some embodiments in general terms, references will now be made to the accompanying drawings, which are not drawn to scale, and wherein:

FIG. 1A is an example circuit illustration of a half-bridge topology configured high switching-speed power module;

FIG. 1B is an example crosstalk effect occurred within a half-bridge high switching-speed power module during a switching transient period;

FIG. 2A is an example circuit illustration of a half-bridge high switching-speed power module with an internal gate resistor causing a crosstalk effect;

FIG. 2B is an example internal view of the half-bridge high switching-speed power module with the internal gate resistor integrated within the half-bridge high switching-speed power module;

FIGS. 3A, 3B, 3C, and 3D illustrate example switching transients in a phase-leg configuration;

FIG. 4 illustrates an example circuit of an example Miller current cancellation circuit, in accordance with some embodiments of the present disclosure;

FIGS. 5A and 5B illustrate a first stage and second stage of an example voltage sampling circuit of an example Miller current cancellation circuit, in accordance with some embodiments of the present disclosure;

FIG. 6 illustrates an example voltage inverting circuit of an example Miller current cancellation circuit, in accordance with some embodiments of the present disclosure;

FIG. 7 illustrates example Miller current of an example MOSFET with Miller current cancellation implemented, according to embodiments of the present disclosure;

FIGS. 8A and 8B illustrate non-linearity of Miller capacitance of an exemplary SiC MOSFET;

FIGS. 9A, 9B, and 9C illustrate over-compensation during a top switch turn-on transient with and without an assisting Miller current cancellation circuit according to embodiments of the present disclosure;

FIG. 10 is an example flow chart illustrating an example method for mitigating Miller current using Miller current cancellation circuit, in accordance with some embodiments of the present disclosure;

FIGS. 11A, 11B, 12A, 12B, 13A, 13B, 14A, 14B, 15, 16, 17A, and 17B illustrate example simulation results illustrating a mitigated crosstalk effect in a high switching-speed power module by way of using an assisting Miller current cancellation circuit, in accordance with some embodiments of the present disclosure; and FIG. 18 illustrates an experimental setup for use with verifying embodiments of the present disclosure.

DETAILED DESCRIPTION OF VARIOUS EMBODIMENTS

Various embodiments of the present disclosure now will be described more fully hereinafter with reference to the accompanying drawings, in which some, but not all embodiments of the disclosure are shown. Indeed, the disclosure may be embodied in many different forms and should not be construed as limited to the embodiments set forth herein. Rather, these embodiments are provided so that this disclosure will satisfy applicable legal requirements. The term "or" is used herein in both the alternative and conjunctive sense, unless otherwise indicated. The terms "illustrative," "example," and "exemplary" are used to be examples with no indication of quality level. Like numbers refer to like elements throughout.

Overview

Various embodiments of the disclosure generally relate to a method for eliminating a crosstalk effect in high switching-speed power modules. More specifically, various embodiments of the present disclosure are related to introducing an assisting Miller current cancellation circuit for generating inverse Miller current to mitigate Miller current caused by the crosstalk effect.

High switching-speed power modules are highly used in power electronics, power semiconductor devices, or power systems, including electronic vehicles' systems. Advantages of using the high switching-speed power modules include reduced switching loss and increased power density. However, the abilities of the power modules to switch at a fast speed and operate at higher frequencies brought new challenges or undesirable results to the power electronic applications, including crosstalk effects addressed in the present application.

FIG. 1A illustrates an example circuit of a half-bridge topology configured high switching-speed power module that is connected to a direct current (DC) power source. The half-bridge high switching-speed power module is designed to operate at significant power levels and may be provided in a power semiconductor device. A shown in FIG. 1A, the half-bridge high switching-speed power module comprises an upper SiC MOSFET (denoted by switch S1 with a body diode D1) and a lower SiC MOSFET (denoted by switch S2 with a body diode D2) that are electronically connected is series. As consequences of SiC MOSFETs physical structure, the upper SiC MOSFET comprises three pins, including a drain (denoted by d1), a gate (denoted by g1), and a source (denoted by s1), and the body diode D1 is formed between the drain d1 and the source s1. Similarly, the lower SiC MOSFET comprises three pins, including a drain (denoted by d2), a gate (denoted by g2), and a source (denoted by s2), and the body diode D2 is formed between the drain d2 and the source s2. The source s1 of the upper SiC MOSFET and the drain d2 of the lower SiC MOSFET are electronically connected at a middle point as an output of the half-bridge high switching-speed power module. Hereinafter, for a specific SiC MOSFET (denoted by switch Sn with a body diode Dn), a drain to source voltage is denoted by $V_{dsn}$, a gate to source voltage is denoted by $V_{gsn}$, and a drain to gate voltage is denoted by $V_{gdn}$.

The high switching-speed of the power module may generate a high time-variant voltage, denoted by $$\frac{dV}{dt},$$

at the middle point of the power module during a switching transient period when the switch Si of the upper SiC MOSFET is being turned on. The high $$\frac{dV}{dt},$$

through inductive and capacitive coupling, causes a crosstalk effect and falsely turn on the switch S2 of the lower SiC MOSFET, which could lead to a false triggering of the power semiconductor device comprising the high-bridge switching-speed power module.

FIG. 1B illustrates an example crosstalk effect occurred within the half-bridge switching-speed power module, as illustrated in FIG. 1A, during a switching transient period. Specifically, as shown in FIG. 1B, when the switch S1 of the upper SiC MOSFET is being turned on during a switching transient period while the switch S2 of the lower SiC MOSFET remains an off status, a high $$\frac{dV}{dt}$$

will be induced at the middle point because of the high-switching speed. The high $$\frac{dV}{dt}$$

causes the drain to source voltage $V_{ds2}$ of the lower SiC MOSFET to form an oscillating waveform with high voltage overshoot and long oscillation period during the switching transient period, as shown in the upper part of FIG. 1B. The induced high $$\frac{dV}{dt}$$

and $V_{ds2}$ also causes the gate to source voltage $V_{gs2}$ of the lower SiC MOSFET to form an oscillating waveform with high voltage overshoot and long oscillation period during the switching transient period. In circumstances where the $V_{gs2}$ is higher than a threshold voltage $V_t$, as shown in the lower part of FIG. 1B by the overshoot voltage, a shoot through of the power semiconductor device will occur and cause serious damages to the power semiconductor device or a power system.

To prevent the above described false triggering of the power semiconductor devices as illustrated in FIGS. 1A and 1B, solutions have been provided to prevent false triggering caused by crosstalk effects occurred within the high switching-speed power modules. Some existing systems and approaches may address the above false triggering issue through a package design method or a driver design method.

FIG. 2A is an example circuit illustration of a half-bridge high switching-speed power module with an internal gate resistor, denoted by $R_{g(in)}$, that is integrated within the power module causing a crosstalk effect. As shown in FIG. 2A, an additional switch is placed between the gate g2 and the source s2 of the lower SiC MOSFET. The additional switch is closed while the power semiconductor device is in an off status. By way of closing the additional switch, the coupling current will flow through the low impedance path instead of falsely triggering the lower SiC MOSFET. Similarly, an additional switch may alternatively be placed inside a driver to prevent the false triggering of the lower SiC MOSFET.

However, the above mentioned package design method or driver design method does not consider internal resistors that are directly connected to the gate g2 of the lower SiC MOSFET, as denoted by $R_{g(in)}$ in FIG. 2A. Due to the existence of the discrete internal resistors, the Miller clamp cannot be bypassed by the additional switch through the above package design method or the driver design method, and thus, crosstalk effects will still occur. The half-bridge high switching-speed power module shown in FIG. 2A may further include an internal inductor, denoted by $L_{g(in)}$. For an example SiC MOSFET power module, the resistance value of $R_{g(in)}$ is generally around 3 ohms and the inductance value of $L_{g(in)}$ is generally around 50 nH. While the SiC MOSFET power module is operated at high switching-speed, the voltage drop on $R_{g(in)}$ and $L_{g(in)}$ will cause a false triggering of the SiC MOSFET power module that cannot be prevented using the above package design method or the driver design method.

FIG. 2B is an example internal view of the half-bridge high switching-speed power module with the internal gate resistor, as shown in FIG. 2B, that is integrated within the half-bridge high switching-speed power module. Since the internal gate resistor is integrated within the half-bridge high switching-speed power module, it can only be designed around directly inside the power module during the package layout design process to mitigate the crosstalk effects.

FIGS. 3A, 3B, 3C, and 3D illustrate example switching transients in a phase-leg configuration. There are four switching states for the switches in a phase-leg circuit: top switch turn-on trainset, top switch turn-off trainset, bottom switch turn-on transient, bottom switch turn-off transient. During the switching transients of one switch, the other switch is off.

Figure 3A:
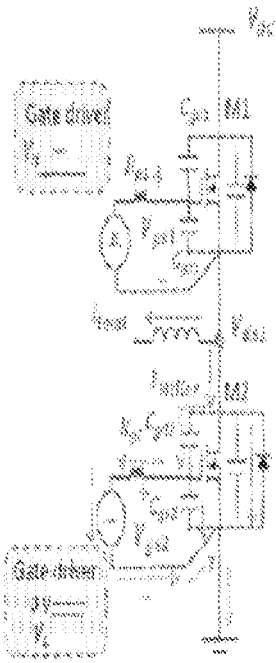

The four switching transients of the devices in a phase-leg configuration are presented in FIGS. 3A-3D. The gate driver signals of each device, as well as the load current direction, indicate the switching states. The current flows through the junction capacitance of the M2 is shown in FIGS. 3A-3D. Because top switch and bottom switch are symmetrical, the transient analysis of M1 is the same with M2. During M1 turn-on transient, as shown in FIG. 3A. The drain to source voltage of the bottom switch M2 rises drastically. Because of the presence of $$\frac{dV_{ds2}}{dt},$$

a current is induced, flowing through the Miller capacitance of M2. This current is referred to as the Miller current. The drain to gate voltage of M2 is given by:

$$V_{dg2} = V_{ds2} - V_{gs2} \quad (1)$$

In high power applications, the gate voltage of M2 is much smaller than the drain to source voltage, hence $V_{dg2} \approx V_{ds2}$. The derivation of the drain to gate voltage can be expressed as:

$$\frac{dV_{dg2}}{dt} = \frac{dV_{ds2}}{dt} \quad (2)$$

The Miller current can be expressed as:

$$I_{Miller} = C_{gd2} \cdot \frac{dV_{ds2}}{dt} \quad (3)$$

Because $$\frac{dV_{ds2}}{dt}$$

in this state is positive, the induced gate voltage is higher than the off-state driver voltage $V_L$. The gate voltage $V_P$ is given by:

$$V_P = V_L + R_{g2} \left| I_{miller} \left( 1 - e^{-\frac{1}{R_{g2} C_{gs2}} t} \right) \right| \quad (4)$$

Figure 3B:
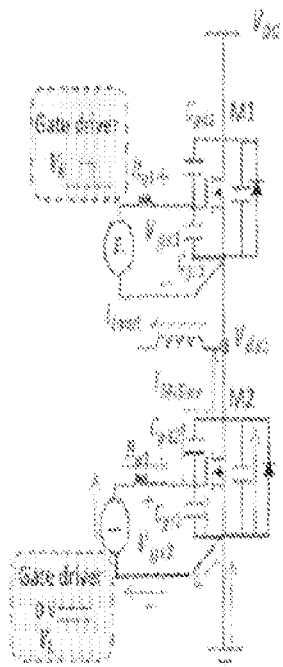

Similarly, during M1 turn-off transient, as shown in FIG. 3B, the drain to source voltage of M2 drops drastically. Because $$\frac{dV_{ds2}}{dt}$$

in this state is negative, the induced gate voltage is lower than $V_L$. The gate voltage $V_N$ is given by:

$$V_N = V_L - R_{g2} \left| I_{miller} \left(1 - e^{\frac{1}{R_{g2}C_{gs2}}t}\right)\right| \quad (5)$$

Figure 3C:
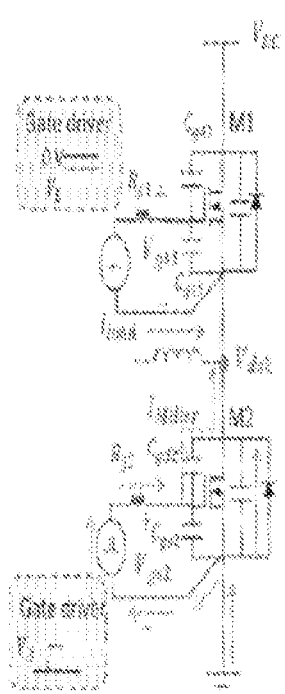

During the M2 turn-on transient, as shown in FIG. 3C, the drain to source voltage oM2 decreases during the Miller plateau while $V_{gs2}$ is nearly constant. As a result, $V_{dg2} \approx V_{ds2}$. The turn-on voltage slope of M2 is given by:

$$\left.\frac{dV_{ds2}}{dt}\right|_{on} = \frac{-|I_{Miller}|}{C_{gd2}} \quad (6)$$

Figure 3D:
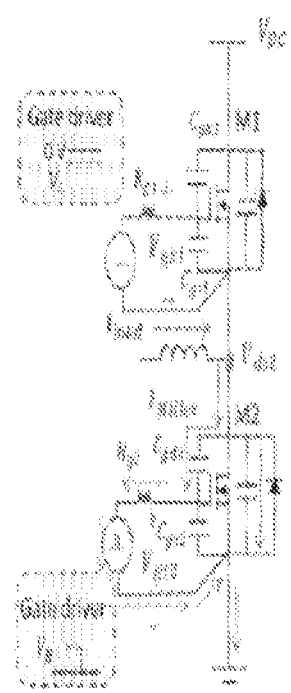

Similarly, during the M2 turn-off transient, as shown in FIG. 3D, the drain to source voltage of M2 decreases during the Miller plateau. The turn-off voltage slope of M2 is given by:

$$\left.\frac{dV_{ds2}}{dt}\right|_{off} = \frac{-|I_{Miller}|}{C_{gd2}} \quad (7)$$

Shown by equations (4)-(7), the root cause of the crosstalk and the miller plateau can be concluded as the miller current. Accordingly, if the Miller current is canceled, the switching speed of the MOSFET can be increased while the induced gate voltage spikes are suppressed.

Systems structured in accordance with various embodiments of the present disclosure overcome challenges faced by existing systems by way of utilizing an assisting Miller current cancellation circuit to generate inverse Miller current for canceling Miller current induced by the crosstalk effect occurred in the high switching-speed power module. The Miller current cancellation circuit introduced in the present disclosure may comprise a voltage divider, a two-stage low power inverter, and a compensation capacitor. The voltage divider may comprise a first resistor with a first resistance value and a second resistor with a second resistance value. The two-stage low power inverter may comprise a first stage circuit and a second stage circuit connected in series to generate a voltage gain in combination. A capacitance value of the compensation capacitor may be selected based on designing the first resistance value, the second resistance value, and the voltage gain, with regard to an average Miller capacitor value during the Miller current charging process. Through utilizing the assisting Miller current cancellation circuit, both the internal resistors, the oscillation feature of $V_{ds2}$, and the non-linear feature of the Miller capacitor are able to mitigate crosstalk effects. Therefore, a better mitigation result is achieved compared to the traditional package design method or the driver design method. Furthermore, unlike the above mentioned package design method or the driver design method, the assisting Miller current cancellation circuit may be designed outside of the package layout design process. As a result, the Miller current cancellation circuit can flexibly be designed or adjusted without affecting the design process of the power module.

As such, systems structured in accordance with various embodiments of the disclosure provide specific, technical solutions to technical problems faced by existing systems, the details of which are described hereinafter.

Definitions

As used herein, the terms "circuit," "circuitry," "module," "module packaging," "semiconductor device," and similar terms may be used interchangeably and should be understood broadly to include hardware and, in some embodiments, electronic circuit packages or electronic circuit components for configuring the hardware. For example, in some embodiments, "circuit" may include electronic circuit components, such as capacitors, resistors, inductors, inverters, amplifiers, diodes, transistors, and the like.

As used herein, the term "high switching-speed power module" refers to an electric circuit comprising power electronic circuit components or power semiconductor devices that are configured to provide electrical contact, thermal contact, or electrical insulation in a power conversion equipment operated at high frequencies with a high switching-speed. In embodiments, the high switching-speed power module may comprise power electronic switches or diodes, such as SiC MOSFETs comprising silicone gel for insulation and heat dissipation.

As used herein, the term "middle point" refers to an electronic circuit connection point between power electronic switches integrated in a high switching-speed power module. In embodiment, the high switching-speed power module may comprise multiple power electronic switches, such as an upper SiC MOSFET and a lower SiC MOSFET. In such an embodiment, the two SiC MOSFETs may be configured in a half-bridge topology that uses the two SiC MOSFETs as input switches to control the output voltage of the high switching-speed power module. In such an embodiment, the upper SiC MOSFET and the lower SiC MOSFET are connected in series at the middle point of the high switching-speed power module. The upper SiC MOSFET and the lower SiC MOSFET serve as input switches to control the output voltage at the middle point of the high switching-speed power module.

As used herein, the term "middle point voltage output" refers to a voltage value of an output measured at the middle point of the high switching-speed power module. The voltage value is measured in units of volts.

As used herein, the term "crosstalk effect" refers to an phenomenon by which a signal transmitted in one part of the electronic circuit creates undesirable effects on the other part of the electronic circuit. For example, in the half-bridge switching-speed power module illustrated in FIG. 1A, a high time-variant voltage $$\frac{dV}{dt}$$

may be generated at the middle point when the upper SiC MOSFET is being turned on. As an undesirable result, the high $$\frac{dV}{dt}$$

may, through inductive and capacitive coupling, cause a crosstalk effect on the lower SiC MOSFET, and resulting a false triggering of the high-bridge switching-speed power module.

As used herein, the term "Miller current" refers to an undesirable current of one part of an electronic circuit that is induced due to the crosstalk effect caused by another part of the electronic circuit. Miller current is generated due to an undesired Miller phenomenon that causes crosstalk effects. The Miller phenomenon or Miller effect was named after and identified by John Milton Miller in triode vacuum tubes in 1920. However, the Miller phenomenon is identified in modern devices, such as SiC MOSFETs. Miller current is measured in units of amperes and being used to model the crosstalk effect. As used herein, the term "inverse Miller current" refers to a current generated by an assisting Miller current cancellation circuit (defined below) that flows in an opposite direction of the Miller current it is intended to cancel.

As used herein, the term "Miller capacitor" refers to a parasitic capacitor of SiC MOSFETs that causes the generation of Miller current induced by the crosstalk effect occurred between the SiC MOSFETs. For example, in the half-bridge switching-speed power module illustrated in FIG. 1B, a Miller capacitor (hereinafter denoted by $C_{gd2}$) is located between the gate g2 and the drain d2 of the lower SiC MOSFET that generates the Miller current induced by the upper SiC MOSFET.

As used herein, the term "Miller current charging process" refers to a processing period when the Miller capacitor is being charged by the Miller current. For example, in the half-bridge switching-speed power module illustrated in FIG. 1B, while the gate to source voltage $V_{ds2}$ of the lower SiC MOSFET is increased due to the crosstalk effect induced by the switch transient triggering process of the upper SiC MOSFET, the Miller capacitor $C_{gd2}$ is charged by the induced Miller current $I_{Miller}$ generated as the result of the increasing $V_{ds2}$.

As used herein, the term "average Miller capacitance value" refers to an averaged capacitance value calculated during the Miller current charging process. The Miller capacitance value is measured in units of farads.

As used herein, the term "assisting Miller current cancellation circuit" refers to an electric circuit that is used to generate inverse Miller current for mitigating the Miller current induced by the crosstalk effect occurred within a high switching-speed power module. In embodiments, the assisting Miller current cancellation circuit may comprise a voltage divider, a two-stage low power inverter, and a compensation capacitor. The voltage divider and the two-stage low power inverter are configured to provide a negative voltage to the compensation capacitor for generating the inverse Miller current, and thus, mitigating the undesirable crosstalk effect.

As used herein, the term "voltage divider" refers to a passive linear circuit that produces, by sampling the input voltage, an output voltage that is a fraction of its input voltage. Voltage division is the result of distributing the input voltage among the components, such as resistors, of the voltage divider.

As used herein, the term "two-stage low power inverter" refers to an electronic device or electronic circuit that is used to invert and amplify the input voltage to generate a voltage output with a voltage gain.

As used herein, the term "first stage voltage output" refers to a voltage output of the first stage circuit within the two-stage low power inverter, which serves as an input of the second stage circuit of the two-stage low power inverter. The first stage voltage output is measured in units of volts.

As used herein, the term "second stage voltage output" refers to a voltage output of the second stage circuit within the two-stage low power inverter. The second stage voltage output is generated based on the received first stage voltage output as its input. The second stage voltage output is measured in units of volts.

As used herein, the term "voltage gain" refers to a ratio of output voltage to input voltage of the two-stage low power inverter. The voltage gain is calculated based on dividing an output voltage value measured at the output port of the two-stage low power inverter by an input voltage value measured at the input port of the two-stage low power inverter.

As used herein, the term "compensation capacitor" refers to a capacitor selected to be included in an assisting Miller current cancellation circuit that is configured to generate inverse Miller current to compensate or mitigate the Miller current induced by a crosstalk effect occurred within a high switching-speed power module. In embodiments, the compensation capacitor may be selected or designed based on resistors included in the voltage divider, a voltage gain of the two-stage low power inverter, and an average Miller capacitance value calculated during the Miller current charging process.

As used herein, the term "compensation capacitance value" refers to a capacitance value that is associated with the compensation capacitor. The Miller capacitance value is measured in units of farads.

As used herein, the term "inverting operational amplifier" refers to an operational amplifier in which the output of the operational amplifier is given as feedback to the input port using a feedback resistor. The closed loop inverting operational amplifier used negative feedback generated by the feedback resistor to control the voltage gain of the amplifier. In embodiments, the inverting operation amplifier is used to generate negative voltage gain for the purpose of producing inverse Miller current that flows in the opposite direction of the Miller current.

As used herein, the term "class AB power amplifier" refers to a class of power amplifiers which amplifies the output signal for generating an increased inverse Miller current. The class AB power amplifier combines the advantages of the class A amplifiers and the class B amplifiers while minimizing problems of low efficiency associated with the class A amplifiers and high distortion associated with the class B amplifiers.

As used herein, the term "class A amplifier" refers to a class of power amplifiers in which the active output transistors conduct over the entire cycle (conduction angle of 360 degrees) of the input signal waveform. To amplify the input signal, all of the output transistors within the class A amplifiers are used during the entire cycle. The class A amplifiers are associated with features of high linearity and low efficiency.

As used herein, the term "class B amplifier" refers to a class of power amplifiers in which the active output transistors only conduct during half cycle (conduction angle of 180 degrees) of the input signal waveform. To amplify the input signal, a half of the transistors are used during a first half of the cycle to generate positive outputs, while the other half of the transistors are used during a second half of the cycle to generate negative outputs. The class B amplifiers are associated with features of high efficiency and high distortion due to the crossover point when the output transistors transition from an on status to an off status.

As used herein, the term "half-bridge topology" refers to an electronic components configuration or layout of two input electronic components, which is used to control the output voltage measured at a connection point of the two input electronic components.

As used herein, the term "half-bridge middle point" refers to an electronic connection point between two electronic components that are configured as the half-bridge topology.

As used herein, the term "silicon carbide (SiC) metal-oxide-semiconductor field-effect transistor (MOSFET)" refers to a power electronic switch using in a high switching-speed power module. Due to the characteristics of SiC material, SiC MOSFET has the advantages of increasing power density, decreasing switching losses, and improving thermal capabilities, that may improve operation performance of a high switching-speed power module.

Example Apparatus Architecture for Implementing Embodiments of the Present Disclosure Methods and apparatuses of the present disclosure may be embodied by any of a variety of power systems, including semiconductor devices, power modules, or power packages with high switching-speed and operated at high frequencies. For example, the method or apparatus of an example embodiment may be embodied by a half-bridge high switching-speed power module along with an assisting Miller current cancellation circuit located within a power system.

FIG. 4 illustrates an example assisting Miller current cancellation circuit, in accordance with some embodiments of the present disclosure. The example assisting Miller current cancellation circuit is also referred to herein as a Miller current cancellation technique circuit or MCCT circuit. In embodiments, an example MCCT circuit 400 comprises a voltage sampling circuit (e.g., a VSC) 402, a voltage-inverting circuit (e.g., a VIC) 404, and an injection capacitor $C_{inj}$ 406.

The input voltage of the VSC 402 is the drain to source voltage of the SiC MOSFET 401. As shown in FIG. 4, the VSC 402 consists of a voltage-diving impedance network and a low power MOSFET Q1. Impedance $$Z_{i(i=1\ to\ 4)} = \frac{R_t}{R_{g2}C_{gs2} + 1}$$

consists of a resistor and a capacitor in parallel. This impedance network provides the same sampling ratio in a wide frequency range.

$$Z_5 = \frac{1}{sC_{dsQ2}}$$

represents the impedance of the drain to source junction capacitance of Q1. The gate to drain and gate to source junction capacitance of Q1 are included in Z2 and Z3. The VSC 402 operates in two stages and provides two different gains under different input voltage. The reason for this is to compensate for the non-linearity of the Miller capacitance under different drain to source voltage levels.

When the input voltage $V_{ds}$ is lower than $V_{div}$, the gate to source voltage lower power MOSFET Q1 $V_{Z3}$ is below its threshold voltage $V_{thQ1}$. Therefore, Q1 is off, as shown in FIG. 5A. The dynamic gain of the VSC 402 in stage 1 is defined as:

$$G_{s1} = \frac{dV_{VS}/dt}{dV_{ds}/dt} = \frac{Z_{Q1} + Z_4}{Z_{VD} + Z_{Q1}} \tag{8}$$

The dividing voltage $V_{div}$ is given by:

$$V_{div} = V_{thQ1}\frac{(Z_{Q1} + Z_{VD})(Z_2 + Z_3)}{Z_{Q1}Z_3} \tag{9}$$

Where $$Z_{Q1} = \frac{Z_5(Z_2 + Z_3)}{Z_2 + Z_3 + Z_5}$$

and $Z_{VD}=Z_1+Z_4$. When $V_{ds}$ is higher than $V_{div}$, Q1 is on, as shown in FIG. 5B. The channel of Q1 provides a low impedance path after turned on and bypasses $Z_{Q1}$.

The voltage of Q1 can be calculated based on the circuit in FIG. 5B. Once turned on, Q1 always operates in the saturation region. The channel current of Q1 is given by:

$$i_{Q1}=g_{mQ1}\cdot(V_{Z3}-V_{thQ1}) \tag{10}$$

Where $g_{mQ1}$ and $V_{thQ1}$ are the transconductance and the threshold voltage of Q1, respectively. The drain to source voltage of Q1 is calculated as:

$$V_{Q1} = \frac{V_{ds} + g_{mQ1}Z_{VD}V_{thQ1})}{1 + \frac{Z_{VD}}{z_{Q1}} + \frac{g_{mQ1}Z_3Z_{VD}}{Z_2 + Z_3}} \tag{11}$$

In practice, $Z_{VD}$ has a large value (greater than $10^7$ ohms) at low frequencies to reduce the power loss of the VSC 402. The value of $(1+Z_{VD}/Z_{Q1})$ is determined by the ratio of impedance $Z_{VD}$ and $Z_{Q1}$, which is <100. Therefore, the following assumption can be made:

$$\frac{g_{mQ1}Z_3Z_{VD}}{Z_2 + Z_3} \gg 1 + \frac{Z_{VD}}{Z_{Q1}} \tag{12}$$

Based on (12), the VQ1 in (11) can be simplified as:

$$V_{Q1} = \frac{Z_2 + Z_3}{Z_3}V_{thQ1} \tag{13}$$

The second stage output voltage of VSC 402 $V_{VS2}$ is given by:

$$V_{VS2} = \frac{Z_4}{Z_{VD}}V_{ds} + \frac{Z_1}{Z_{VD}}V_{Q1} \tag{14}$$

The dynamic gain of VSC 402 in stage 2 is given by:

$$G_{s2} = \frac{dV_{VS}/dt}{dV_{ds}/dt} = \frac{Z_4}{Z_{VD}} \tag{15}$$

Based on (8) and (15), the voltage sampling circuit 402 has a large gain when the input voltage is low and small gain when the input voltage is high.

The function of the VIC 404 is to invert the voltage signal sampled by the VSC 402. As shown in FIG. 6, the VIC 404 consists of two resistors, a low power MOSFET Q2, and a diode $D_f$. The VIC 404 connects to a DC power supply $V_{cc}$. This power supply can be the same power supply used by the driver or an independent power supply. The diode Df is used to avoid interference from the succeeding circuits. $R_{inj}$ is the injection resistor. $R_s$ is the feedback resistor.

After Q2 turns on, the channel current increases quickly and dominates the current flows through $R_{inj}$ and $R_s$. Assuming Q2 operates in the saturation region, the channel current $i_d$ is:

$$i_d = g_{mQ2}(V_{gsQ2} - V_{thQ2}) \quad (16)$$

$$V_{gsQ2} = V_{VS} - R_s i_d \quad (17)$$

Solving (17) and (18) simultaneously, $$i_d = \frac{g_{mQ2}(V_{VS} - V_{th})}{1 + g_{mQ2} R_S} \quad (18)$$

The output voltage of the VIC 404 is given by:

$$V_{IV} = V_{CC} - i_d R_{inj} \quad (19)$$

Substituting (18) into (19):

$$V_{IV} = V_{CC} - \frac{g_{mQ2} R_{inj}(V_{VS} - V_{th})}{1 + g_{mQ2} R_s} \quad (20)$$

The derivation of (20) over time is:

$$\frac{dV_{IV}}{dt} = -\frac{g_{mQ2} R_{inj}}{1 + g_{mQ2} R_S} \cdot \frac{dV_{VS}}{dt} \quad (21)$$

Substituting (8) and (14) to (21), the total gain of the two sub-circuits can be calculated as:

$$G_{MCCT} = \frac{dV_{IV}/dt}{dV_{ds}/dt} = \begin{cases} -\dfrac{Z_{Q1} + Z_4}{Z_{VD}} \cdot \dfrac{g_{mQ2} R_{inj}}{1 + g_{mQ2} R_S}, & V_{ds} < V_{div} \\ -\dfrac{Z_4}{Z_{VD}} \cdot \dfrac{g_{mQ2} R_{inj}}{1 + g_{mQ2} R_S}, & V_{ds} \geq V_{div} \end{cases} \quad (22)$$

After the VSC 402 and VIC 404 are implemented, the cancellation current is injected to the gate of the SiC MOSFET 401 through the injection capacitor $C_{inj}$ 406 as shown in FIG. 7. In practice, the $dV_{IV}/dt$ is more than 10 times $dV_{gs}/dt$. As a result, $$I_{inj} = C_{inj}\left(\frac{dV_{IV}}{dt} - \frac{dV_{gs}}{dt}\right) \approx C_{inj} \frac{dV_{IV}}{dt} = C_{inj} G_{MCCT} \frac{dV_{ds}}{dt} \quad (23)$$

During the turn-on of the complementary switch, the drain to source voltage rises. the positive induced gate voltage of the MOSFET is given by:

$$V_{PM} = V_L + R_g |I_{Miller} + I_{inj}|\left(1 - e^{\frac{-1}{R_g C_{gs}}t}\right) \quad (24)$$

Similarly, $$V_{NEGM} = V_L - R_{g2}|I_{Miller} + I_{inj}|\left(1 - e^{\frac{-1}{R_g C_{gs}}t}\right) \quad (25)$$

During the switching transient of the MOSFET, $$i_g = -(I_{Miller} + I_{inj}) \quad (26)$$

The turn-on speed of the MOSFET can be given by:

$$\left.\frac{dV_{ds}}{dt}\right|_{on} = \frac{-|I_{Miller} + I_{inj}|}{(C_{gd2} + C_{inj} G_{MCCT})} \quad (27)$$

Similarly, $$\left.\frac{dV_{ds}}{dt}\right|_{off} = \frac{|I_{Miller} + I_{inj}|}{(C_{gd2} + C_{inj} G_{MCCT})} \quad (28)$$

Compared with (4) to (7), the sum of injected current and the Miller current dictates the Miller effect in (24), (25), and (27), (28). If $I_{inj} = -I_{Miller}$, the Miller current will be cancelled. The Miller effect is, therefore, cancelled. To achieve this, $C_{inj}$ is calculated by (29) based on (3) and (23):

$$C_{inj} = -\frac{C_{gd}}{G_{MCCT}} \quad (29)$$

The junction capacitance of Q2 should be included in C2 and C3. To wit, $C2 = C_{2add} + C_{gdQ2}$, $C3 = C_{3add} + C_{gsQ2}$. Where $C_{2add}$ and $C_{3add}$ are the added external capacitors.

Miller capacitance can change drastically with the drain to source voltage $V_{ds}$. To satisfy (29) with a constant $C_{inj}$, $G_{MCCT}$ needs to change with $V_{ds}$. In embodiments, this is achieved by a piecewise linearization method. As shown in FIG. 8A, the value of Miller capacitance decreases quickly and eventually becomes nearly constant with VDS. The relationship between Miller capacitance and $V_{ds}$ is:

$$C_{gd}(V_{ds}) = \frac{c_0}{\sqrt{1 + V_0 V_{ds}}} \quad (30)$$

Where $C_0$ and $V_0$ are dimension-related constants, they can also be acquired from datasheets. The value of the Miller capacitance vs. drain to source voltage is calculated with (30) for a SiC MOSFET (e.g., SCT3060AR) and shown in FIG. 8A. The calculations matches the datasheet very well.

A distinction is made at $V_{div}$ in FIG. 8B between high $V_{ds}$ and low $V_{ds}$ to realize the piecewise linearization. When $V_{ds}$ is low, the Miller capacitance changes drastically with $V_{ds}$. When $V_{ds}$ is high, the Miller capacitance is nearly constant. To define $V_{div}$, the Miller capacitance changing rate is calculated based on (30):

$$\frac{d(C_{gd})}{dV_{ds}} = -C_0 V_0 (1 + V_0 V_{ds})^{-\frac{3}{2}} \quad (31)$$

The value of $V_{div}$ is defined as the value of $V_{ds}$ when (30) is smaller than 1 pF/V. Namely, $$V_{div} = \frac{(C_0 V_0)^{\frac{2}{3}} - 1}{V_0} \quad (32)$$

During switching transient, the Miller current is essentially the total charge transferred through Miller capacitance over time. When $V_{ds}$ changes from 0 V to $V_{DC}$ the total charge of Miller capacitance is given by:

$$Q_{total} = \int_0^{V_{DC}} C_{gd}(v_{ds}) dv_{ds} \quad (33)$$

Based on (34), the total charge is divided into two parts:

$$Q_L = \int_0^{V_{div}} C_{gd}(v_{ds}) dv_{ds} \quad (34)$$

$$Q_H = \int_{V_{div}}^{V_{DC}} C_{gd}(v_{ds}) dv_{ds} \quad (35)$$

The non-linear behavior of the Miller capacitance can be piecewise linearized by two constant capacitances with the same change:

$$\int_0^{V_{div}} C_{const1} dv_{ds} = \int_0^{V_{div}} C_{gd}(v_{ds}) dv_{ds} \quad (36)$$

$$\int_{V_{div}}^{V_{DC}} C_{const2} dv_{ds} = \int_{V_{div}}^{V_{DC}} C_{gd}(v_{ds}) dv_{ds} \quad (37)$$

After linearization, the Miller capacitance is given by:

$$C_{gd} = \begin{cases} C_{const1}, & V_{ds} < V_{div} \\ C_{const2}, & V_{ds} \geq V_{div} \end{cases} \quad (38)$$

To compensate the non-linearity of Miller capacitance, the two gains of VSC should satisfy $G_{S1}/G_{S2} = C_{const1}/C_{const2}$.

The impedance network value can therefore be calculated as:

$$\frac{Z_{Q1} + Z_4}{Z_4} = \frac{C_{const1}}{C_{const2}} \quad (39)$$

The high voltage gain of the VSC 402 is separated with low voltage gain as long as (12) is true. However, at high frequencies, (12) may not be true because $Z_{VD}$ decreases with frequency. There is a high-frequency limit for the VSC 402. To discuss the high-frequency limit, the left part of (12) is defined as $Z_{hf}$:

$$Z_{hf} = \frac{g_{mQ1} Z_3 Z_{VD}}{Z_2 + Z_3} \quad (40)$$

At low frequencies, $Z_{hf}$ has a very large value because $Z_{VD}$ has a large value (e.g., (12) holds true). At high frequencies, the impedance Z1 to Z4 in the VSC 402 are mainly capacitive. Accordingly, (40) can be expressed as:

$$Z_{hf} = \frac{1}{s} \cdot G_{hf} \quad (41)$$

Where $G_{hf} = g_{mQ1} C_2/C_1(C_2 + C_3)$. Based on (41), $Z_{hf}$ decreases with a −20 dB/dec slope with frequency. When $Z_{hf}$ becomes comparable with $Z_{VD}/Z_{Q1}$, (12) is no longer true. In such a situation, the VSC 402 loses the ability to provide a low gain at high input voltage, while the gain of the VIC 404 does not change. Consequently, the high frequency components of the sampled signal, which is the SiC MOSFET drain to source voltage, is large, the injected high frequency signals with over-compensate the Miller current, causing additional interference.

To avoid the over-compensation, $Z_{hf}$ should be large in the frequency range of the SiC MOSFET voltage spectrum. The spectrum of SiC MOSFET switching waveform decreases with frequency. After the cross frequency $1/t_{sw}$, the magnitude of the spectrum decreases at −40 dB/dec, where $t_{sw}$ is the switching time of the SiC MOSFET. The magnitude of the components higher than $10/t_{sw}$ is very small. To improve high frequency performance, $Z_{hf}$ is preferably at least larger than ZVD/ZQ1 at all frequencies below $10/t_{sw}$. The $G_{hf\text{-}crit}$ is defined as:

$$G_{hf} = 2\pi \cdot \frac{Z_{VD}}{Z_{Q1}} \cdot \frac{10}{t_{sw}} \quad (42)$$

An example is illustrated in FIGS. 9A, 9B, and 9C. The induced positive gate voltage due to the turn-on transition of the other switch in a phase-leg configuration is shown in FIG. 9A. The phase-leg circuit is tested under a low power condition (100 V/3 A) for safety reasons. FIG. 9B shows a case where the MCCT is applied to the MOSFET with a $G_{hf} < G_{hf\text{-}crit}$. The over-compensation can be clearly observed. The gate voltage is higher than the case without the MCCT due to additional high-frequency signals. Another case where the same MCCT is applied to the same MOSFET but with a $G_{hf} > G_{hf\text{-}crit}$ is shown in FIG. 9C. Because the $Z_{hf}$ maintains a high value at high frequencies, there are no additional high-frequency signals injected to the gate. The parameters of VSC shall be selected so that $G_{hf} > G_{hf\text{-}crit}$.

Before Q2 is on, the channel current of Q2 is zero. $C_{gsQ2}$ is charged by $V_{VS}$. A delay time $t_{dQ2}$ is determined by the time constant $\tau_{Q2} = R_S C_{gsQ2}$. The delay time can be reduced by use small value of $R_S$. After Q2 is on, to achieve the function of VIC 404, Q2 must operate in the saturation region. Namely, $$V_{dsQ2} > V_{gsQ2} - V_{thQ2} \quad (43)$$

Where $V_{dsQ2}$, $V_{gsQ2}$ and $V_{thQ2}$ are the drain to source voltage, gate to source voltage and threshold voltage of Q2, respectively. The drain to source voltage is:

$$V_{dsQ2} = V_{cc} - i_d(R_{inj} + R_S) \quad (44)$$

Substitute (18) (19) and (43) to (44), the saturation condition can be calculated as:

$$V_{VSMax} - V_{th} < \frac{V_{cc}(1 + g_m R_S)}{g_m(R_{inj} + R_S) + 1} \quad (45)$$

Where $V_{VSMax}$ is the maximum output voltage of the VSC 402.

$$V_{VSMax} = V_{dsMax} \cdot G_{s2} + V_{Q1} \quad (46)$$

Where $V_{VSMax}$ is the maximum input voltage of the VSC 402. $V_{Q1}$ is given in (13). The value of $R_{inj}$ and $R_S$ are preferably selected to satisfy (45). At the same time, $R_S$ should be kept minimum to reduce the delay time before Q2 is turned on.

Example Processes for Eliminating Crosstalk Effects

FIG. 10 is an example flow chart illustrating an example method for mitigating Miller current using Miller current cancellation circuit, in accordance with some embodiments of the present disclosure.

At operation 702, the method 700 starts with sampling, using a two-stage voltage sampling circuit, a drain to source voltage of a SiC MOSFET of a plurality of SiC MOSFETs;

At operation 704, the method 700 continues with inverting, using a voltage inverting circuit, the sampled drain to source voltage.

At operation 706, the method 700 continues with generating, using an injection capacitor, by way of receiving the inverted sampled drain to source voltage as input, inverse Miller current to mitigate the Miller current within the plurality of SiC MOSFETS.

Experimental Results

An MCCT circuit according to the present disclosure is designed and applied to the SiC MOSFETs in a phase-leg configuration to verify the effectiveness of the proposed circuit. The selected parameters are listed in TABLE I.

TABLE I

| Parameter | Description | Value/name |
|---|---|---|
| $C_1$ | VSC capacitor 1 | 5.1 pF |
| $C_2$ | VSC capacitor 2 | 150 pF |
| $C_3$ | VSC capacitor 3 | 300 pF |
| $C_4$ | VSC capacitor 4 | 1.6 nF |
| $R_{inj}$ | Injection resistor | 10 Ω |
| $R_s$ | Source resistor | 7.5 Ω |
| $C_{inj}$ | Injection capacitor | 4 nF |
| Q1 | VSC MOSFET | IRLMS 1503 |
| Q2 | VIC MOSFET | IRLMS1503 |
| M1, M2 | MOSFETs in the phase-leg circuit | SCT3-6-AR |
| D1, D2 | Anti-parallel diodes in the phase-leg circuit | IDH20G120C5 |
| Drivers | Commercial drivers | 2SC0108T2Dx |

FIGS. 11A, 11B, 12A, 12B, 13A, 13B, 14A, 14B, 15, 16, 17A, and 17B illustrate example simulation results illustrating a mitigated crosstalk effect in a high switching-speed power module by way of using an assisting Miller current cancellation circuit, in accordance with some embodiments of the present disclosure.

Example simulations were conducted in Ansys Simplorer. The phase-leg circuit consists of two SiC MOSFETs and two SiC Schottky diodes. The power semiconductor devices are generated with the device characterization tool of the software. Four switching transients are simulated. When being driven, the gate driver voltage is 15 V for the turn-on process and 0 V for the turn-off process. When being off, the gate driver voltage is 0 V.

Figure 11A:
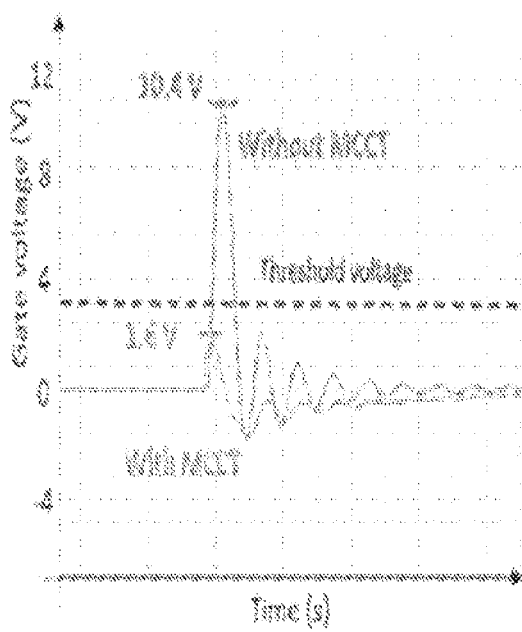
Figure 11B:
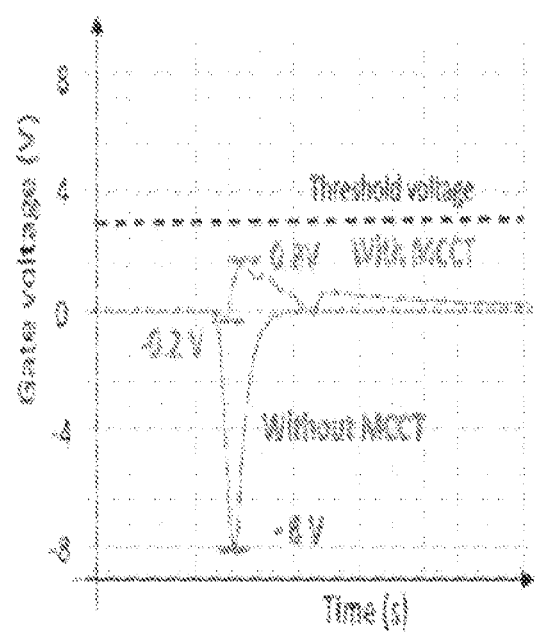
Figures 12A, 12B:
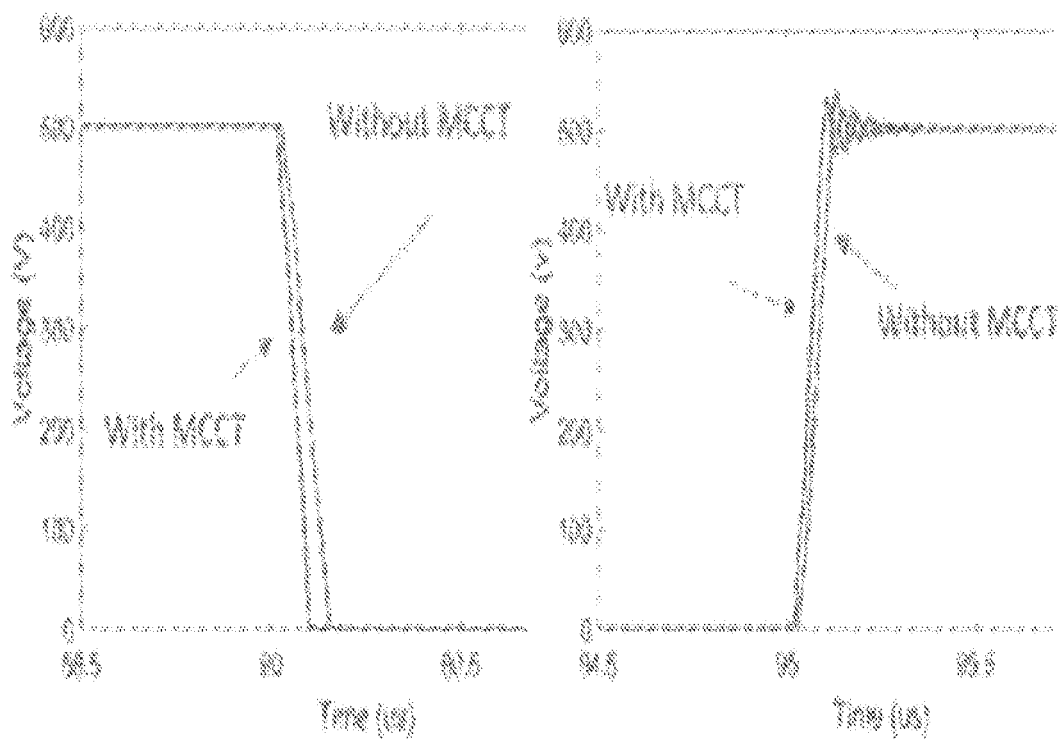

The four switching states discussed above were simulated under a 500 V/20 A condition. The gate resistors are 10Ω. During the top switch turn-on and turn off transient, the gate voltage of the bottom switch is shown in FIGS. 11A and 11B. FIGS. 11A and 11B show that both the positive and negative induced gate voltage are large without the MCCT. With the MCCT added, both positive and negative spikes are effectively suppressed. The magnitude of the positive spike is reduced by more than 85%, and the magnitude of the negative spike is reduced by more than 90%. During the bottom switch turn-on and turn-off transient, the drain to source voltage is shown in FIGS. 12A and 12B. Because of the reduced Miller platform, the turn-on and turn-off speed are increased in the case with the MCCT. The simulation results verify the analysis above.

Example experimental verification (e.g., as opposed to simulations) involved a double pulse test circuit built for the measurement. The phase-leg circuit is fabricated with PCB. Two kinds of prototypes were made, one without the MCCT circuit, the other with the proposed MCCT connected to the gates of the SiC MOSFETs. The layout of the main power circuit is the same for the two prototypes.

The switches in the prototypes are SiC MOSFETs and SiC Schottky diodes. A commercial driver (2SC0108T2Dx) is connected to the gate pin and the Kelvin source pin. The turn-on gate voltage is 15 V, the turn-off gate voltage is −8V. SiC MOSFETs could endure the shoot-through current caused by false triggering in a short time. In the meantime, the gate breakdown caused by the negative gate voltage over-range is non-reversable. As a result, when the device kept off the gate and source terminals are connected with only the gate resistor. The DC decoupling capacitor was 20. The load inductor is 2.5 mH.

The prototype and experiment set up is shown in FIG. 18. The MCCT circuit is on the bottom side of the board. The DC power source that supplies the power loop is Chroma 62024P-600-8. The DC power supply for the driver and MCCT is RIGOL DP832. A wideband (350 MHz) oscilloscope RIGOL MSO4034 is used.

The SiC MOSFETs used in the prototype have a TO-247 package. It has kelvin gate connections to minimize the influence of common source inductance. The voltage probes connect directly to the package terminals. The low voltage probe used in the experiment is RIGOL PVP21250. The probe tips are connected to the gate and Kelvin source of the MOSFET package. As a result, the error brought by the parasitic inductance of the probe is neglectable. Because the drain to source voltage of the SiC MOSFET is much larger than the gate voltage, an isolated high voltage probe is used to measure the drain and source voltage. Only one of the probes is connected to the circuit during measurement each time to avoid the interference brought by the probe impedance. In this way, both gate to source and drain to source voltage can be accurately measured.

Figure 13A:
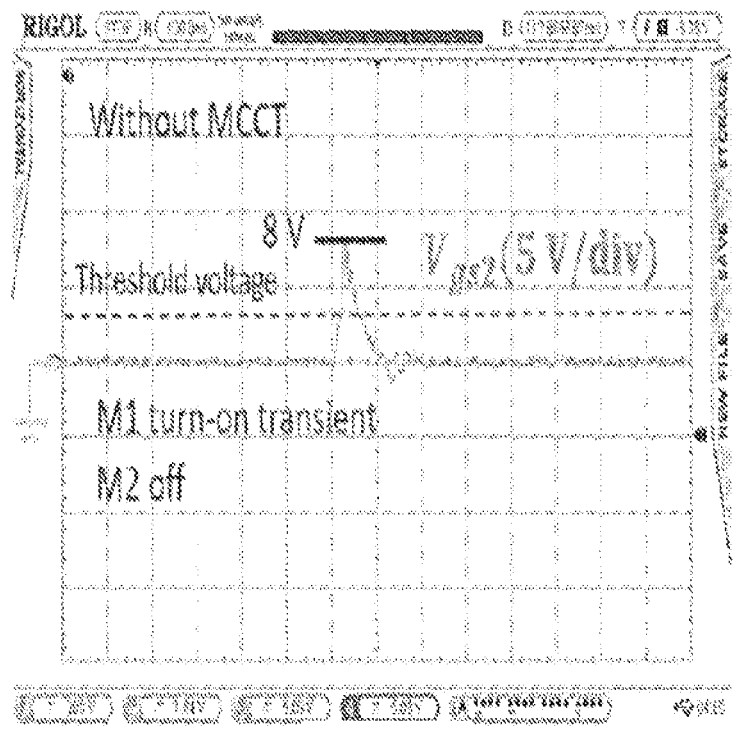
Figure 13B:
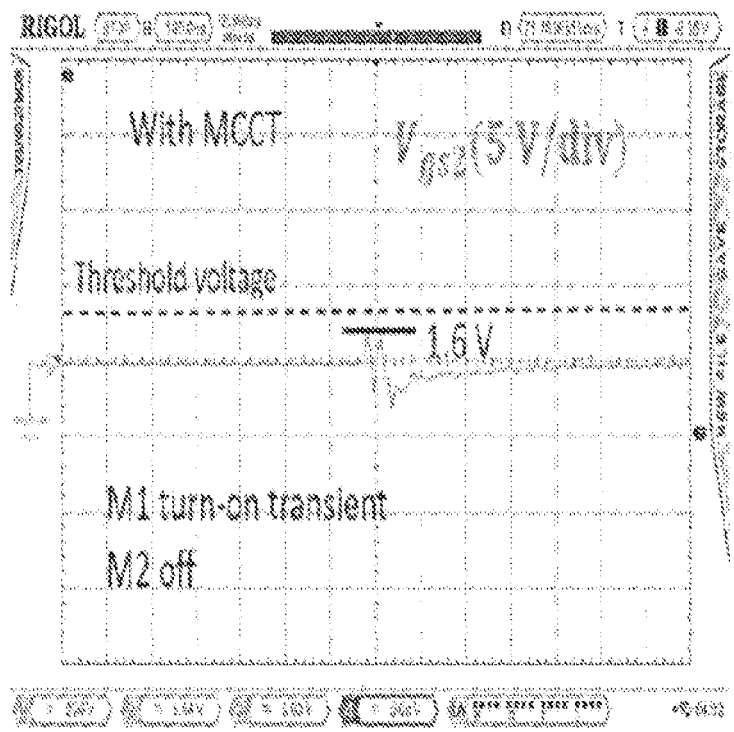
Figure 14A:
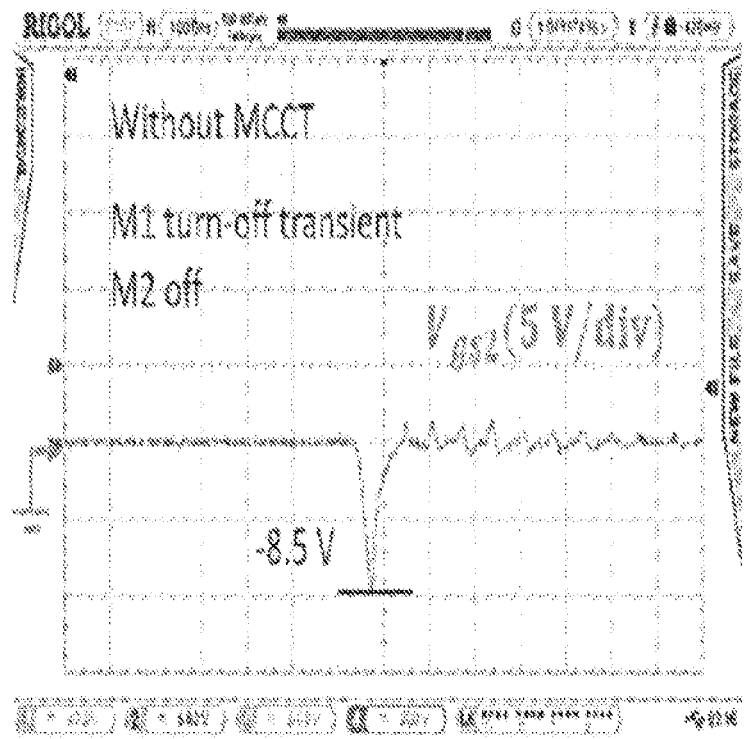
Figure 14B:
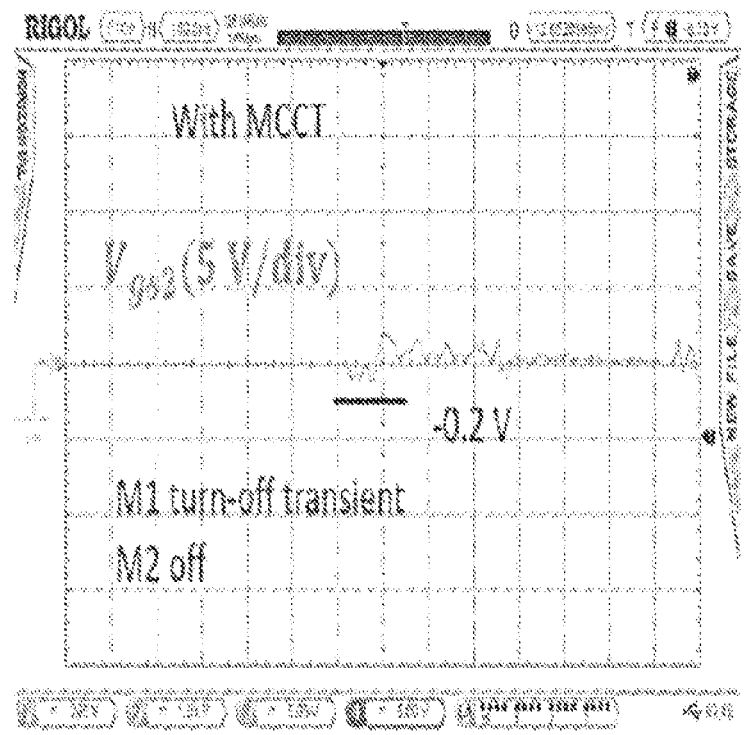
Figure 15:
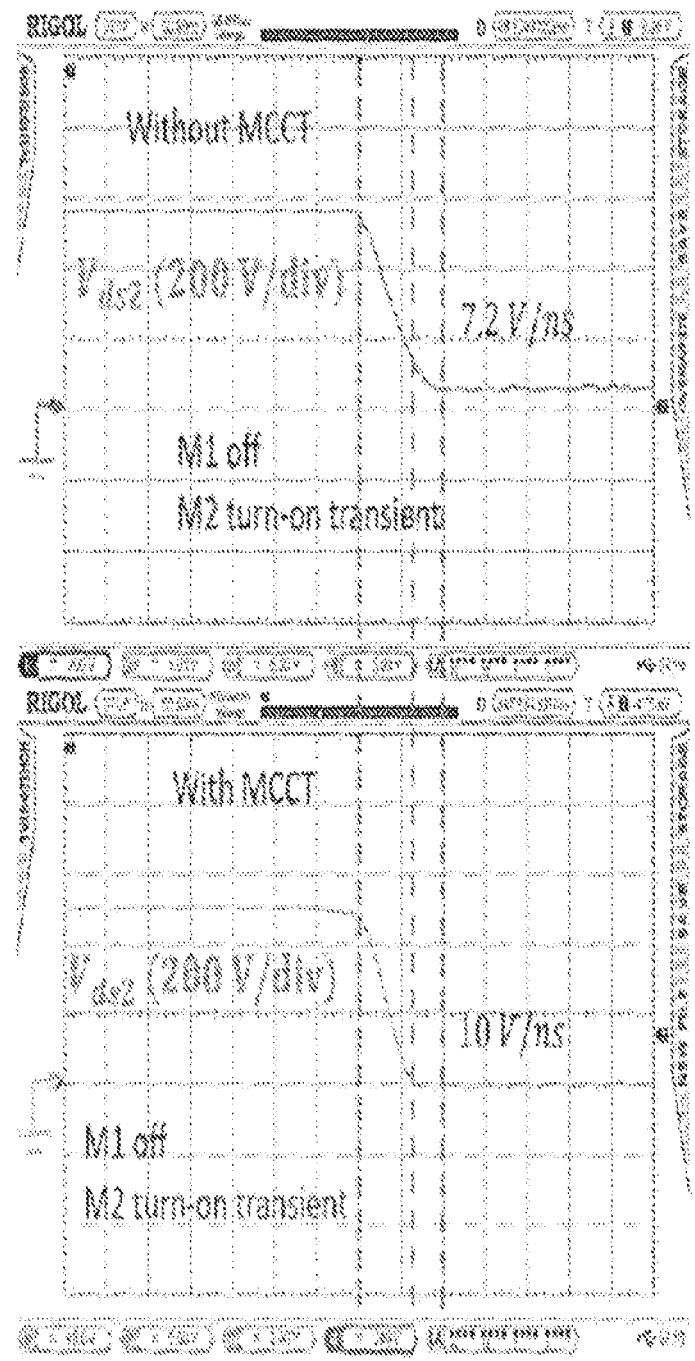

The prototypes are firstly tested with 500 V DC voltage and 20 A load current. Gate resistors used for turn-on and turn-off are 10Ω for both top and bottom switches. The gate voltage waveforms of the bottom switch during top switch switching transients are presented in FIGS. 13A and 13B and FIGS. 14A and 14B. The comparison in FIGS. 13A and 13B show that the positive induced gate voltage spikes are effectively reduced with MCCT. Even with 0 V off state driver voltage, the gate voltage is still below the threshold voltage. FIGS. 14A and 14B show that the negative induced gate voltage is also reduced with the MCCT. Small negative induced gate voltage increases the reliability of SiC MOSFET by avoiding the gate oxide breakdown. As shown in FIG. 15 and FIG. 16, the drain to source voltage during switching transient is compared. It is shown in FIG. 15 and FIG. 16 that both turn-on and turn-off speed of the MOSFET with the MCCT are increased. These test results present agreement with the analysis herein.

The phase-leg circuit could operate under different DC bus voltage. The induced gate voltage under different DC bus voltage is different. The variation is due to the non-linearity of the Miller capacitance. FIGS. 17A and 17B illustrate the absolute peak values of positive and negative induced gate voltage under different DC bus voltage. The load current in these tests are 20 A. FIGS. 17A and 17B show that, with the non-linearity of the Miller capacitance compensated, the proposed MCCT suppresses the induced gate voltage under different DC voltage levels.

Conclusion

Many modifications and other embodiments of the disclosures set forth herein will come to mind to one skilled in the art to which these disclosures pertain having the benefit of the teachings presented in the foregoing description and the associated drawings. Therefore, it is to be understood that the disclosures are not to be limited to the specific embodiments disclosed and that modifications and other embodiments are intended to be included within the scope of the appended claims. Although specific terms are employed herein, they are used in a generic and descriptive sense only and not for purposes of limitation, unless described otherwise.

That which is claimed:

1. An apparatus for reducing Miller effect in SiC MOSFETs, the apparatus comprising:
    a plurality of SiC MOSFETs; and
    a Miller current cancellation circuit configured to mitigate Miller current induced by switching transients associated with the plurality of SiC MOSFETS, the Miller current cancellation circuit comprising:
        a two-stage voltage sampling circuit configured to sample a drain to source voltage of a SiC MOSFET of the plurality of SiC MOSFETs;
        a voltage inverting circuit configured to invert the sampled drain to source voltage; and
        an injection capacitor configured to generate, by way of receiving the inverted sampled drain to source voltage as input, inverse Miller current to mitigate the Miller current within the plurality of SiC MOSFETS.

2. The apparatus of claim 1, wherein the two stage voltage sampling circuit comprises a voltage-dividing impedance network and a first low power MOSFET.

3. The apparatus of claim 1, wherein the voltage inverting circuit comprises an injection resistor, a feedback resistor, and a second low power MOSFET.

4. The apparatus of claim 1, wherein the plurality of MOSFETs is arranged in a phase-leg configuration.

5. The apparatus of claim 3, wherein the voltage inverting circuit further comprises a diode used to avoid interference from succeeding circuits.

6. The apparatus of claim 2, wherein the two stage voltage sampling circuit has a gain that is inversely proportional to its input voltage.

7. The apparatus of claim 2, wherein the voltage dividing impedance network comprises a plurality of resistors connected in series.

8. The apparatus of claim 7, wherein each resistor of the plurality of resistors is connected in parallel to a capacitor of a plurality of capacitors.

9. The apparatus of claim 8, wherein a value of each resistor of the plurality of resistors is selected based upon a desired sampling ratio.

10. The apparatus of claim 9, wherein a first value of a first resistor is 10 MΩ.

11. The apparatus of claim 1, wherein a SiC MOSFET of the plurality of SiC MOSFETS comprises a driver.

12. The apparatus of claim 11, wherein the driver is biased using a first power supply.

13. The apparatus of claim 12, wherein the voltage inverting circuit is biased using the first power supply.

14. The apparatus of claim 12, wherein the voltage inverting circuit is biased using a second power supply.

15. A method for reducing Miller effect in SiC MOSFETs, the method comprising:
    sampling, using a two-stage voltage sampling circuit, a drain to source voltage of a SiC MOSFET of a plurality of SiC MOSFETs;
    inverting, using a voltage inverting circuit, the sampled drain to source voltage; and
    generating, using an injection capacitor, by way of receiving the inverted sampled drain to source voltage as input, inverse Miller current to mitigate the Miller current within the plurality of SiC MOSFETS.

* * * * *